(12) United States Patent
Meaney et al.

(10) Patent No.: US 11,646,861 B2
(45) Date of Patent: May 9, 2023

(54) LOW-LATENCY, HIGH-AVAILABILITY AND HIGH-SPEED SERDES INTERFACE HAVING MULTIPLE SYNCHRONIZATION MODES

(71) Applicant: International Business Machines Corporation, Armonk, NY (US)

(72) Inventors: Patrick James Meaney, Poughkeepsie, NY (US); Ashutosh Mishra, Lagrangeville, NY (US); Paul Allen Ganfield, Rochester, MN (US); Christian Jacobi, West Park, NY (US); Logan Ian Friedman, Nyack, NY (US); Jentje Leenstra, Bondorf (DE); Glenn David Gilda, Binghamton, NY (US); Jason Andrew Thompson, Rochester, MN (US); Yvonne Hanson Kleppel, Houston, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/484,393

(22) Filed: Sep. 24, 2021

(65) Prior Publication Data
US 2023/0098514 A1    Mar. 30, 2023

(51) Int. Cl.
*H04L 7/00*    (2006.01)

(52) U.S. Cl.
CPC .......... *H04L 7/0008* (2013.01); *H04L 7/0079* (2013.01); *H04L 7/0095* (2013.01)

(58) Field of Classification Search
CPC .... H04L 7/0008; H04L 7/0079; H04L 7/0095
See application file for complete search history.

(56) References Cited

U.S. PATENT DOCUMENTS

| | | | |
|---|---|---|---|
| 5,610,953 A | 3/1997 | Betts et al. | |
| 6,459,393 B1 | 10/2002 | Nordman | |
| 6,715,095 B1 * | 3/2004 | Larsen | G06F 1/3237 713/324 |

(Continued)

OTHER PUBLICATIONS

Han et al., "A 10 Gbps SerDes for wireless chip-to-chip communication." 2015 International SoC Design Conference (ISOCC). IEEE. 2015. 2 pages.

(Continued)

*Primary Examiner* — Jaison Joseph
(74) *Attorney, Agent, or Firm* — Cantor Colburn LLP; Jeffrey Ingalls

(57) ABSTRACT

A computer-implemented method includes using a transmitter to send data from the transmitter through a plurality of lanes to a receiver using a synchronous operation mode that includes sending the data from the transmitter through the plurality of lanes to the receiver in a synchronous transmission manner that relies on an alignment between a transmitter clock frequency and a receiver clock frequency. A synchronous operation performance analysis (SOPA) is performed during the synchronous operation mode. A switch from the synchronous operation mode to an asynchronous operation mode is made based on a result of performing the SOPA. The asynchronous operation mode includes sending the data from the transmitter through the plurality of lanes to the receiver without requiring alignment between the transmitter clock frequency and the receiver clock frequency.

25 Claims, 29 Drawing Sheets

(56) References Cited

U.S. PATENT DOCUMENTS

| | | | |
|---|---|---|---|
| 7,251,256 | B1 | 7/2007 | Barry et al. |
| 7,882,307 | B1* | 2/2011 | Wentzlaff ............ G06F 12/0815 |
| | | | 711/119 |
| 8,116,409 | B1 | 2/2012 | Warner |
| 8,149,979 | B2* | 4/2012 | Buchmann .......... G06F 13/4291 |
| | | | 375/357 |
| 8,228,972 | B2 | 7/2012 | Tonietto et al. |
| 8,397,272 | B2* | 3/2013 | Zhu .................... H04N 21/4263 |
| | | | 725/139 |
| 8,832,336 | B2 | 9/2014 | Morrison et al. |
| 8,886,840 | B2* | 11/2014 | Fujimori ................. H04B 1/40 |
| | | | 709/250 |
| 9,071,256 | B1 | 6/2015 | Reiss et al. |
| 9,118,392 | B2 | 8/2015 | Sundar et al. |
| 9,219,560 | B2 | 12/2015 | Hummel |
| 9,306,621 | B2 | 4/2016 | Zhang et al. |
| 9,374,217 | B1 | 6/2016 | Forey et al. |
| 9,734,110 | B2* | 8/2017 | Drapala ............... G06F 13/4221 |
| 9,742,551 | B2 | 8/2017 | Forey et al. |
| 10,084,591 | B1 | 9/2018 | Palusa et al. |
| 10,447,463 | B2 | 10/2019 | Raymond |
| 10,698,440 | B2 | 6/2020 | Carlough et al. |
| 11,031,939 | B1* | 6/2021 | Wolkovitz ............ H03L 7/0802 |
| 2003/0135675 | A1* | 7/2003 | Pontius ............... G06F 13/4031 |
| | | | 710/107 |
| 2005/0160328 | A1 | 7/2005 | Lesartre et al. |
| 2011/0113270 | A1* | 5/2011 | Carter ...................... G06F 1/324 |
| | | | 713/320 |
| 2016/0028534 | A1* | 1/2016 | Sengoku ............... H04L 7/0008 |
| | | | 375/376 |
| 2020/0326866 | A1* | 10/2020 | Catalano ............... G06F 3/0634 |

OTHER PUBLICATIONS

Iniewski et al., "Process and device requirements for mixed-signal integrated circuits in broadband networking." Journal of Telecommunications and Information Technology (2004): 90-98.

List of IBM Patents or Patent Applications Treated as Related; Date Filed: Sep. 24, 2021, 2 pages.

Meaney et al., "Low-Latency Deserializer Having Fine Granularity and Defective-Lane Compensation," U.S. Appl. No. 17/484,415, filed Sep. 24, 2021.

Mueller et al. "Fully redundant clock generation and distribution with dynamic oscillator switchover." IBM journal of research and development 51.1.2 (2007): 145-156.

Ramamoorthy et al., "High speed serial link transmitter for 10Gig ethernet applications" 2010 23rd International Conference on VLSI Design. IEEE. 2010. pp. 246-251.

Sundaram et al., "A Reconfigurable Asynchronous SERDES for Heterogenous Chiplet Interconnects." 2021 22nd International Symposium on Quality Electronic Design (ISQED). IEEE. 2021. 5 pages.

Teich. "The Heart Of AMD's Epyc Comeback Is Infinity Fabric". Next Platform. https://www.nextplatform.com/2017/07/12/heart-amds-epyc-comeback-infinity-fabric/ (Jul. 12, 2017). 19 pages.

Wang et al., "A quad multi-speed serializer/deserializer with analog adaptive equalization." 2004 Symposium on VLSI Circuits. Digest of Technical Papers (IEEE Cat. No. 04CH37525). 2004. 4 pages.

Wolfson et al., "Synchronizing optical data and electrical control planes in asynchronous optical packet switches." 2006 Optical Fiber Communication Conference and the National Fiber Optic Engineers Conference. IEEE. 2006. 3 pages.

Zamarreno-Ramos et al., "An instant-startup jitter-tolerant Manchester-encoding serializer/deserializer scheme for event-driven bit-serial LVDS interchip AER links." IEEE Transactions on Circuits and Systems I: Regular Papers 58.11 (2011): 2647-2660.

* cited by examiner

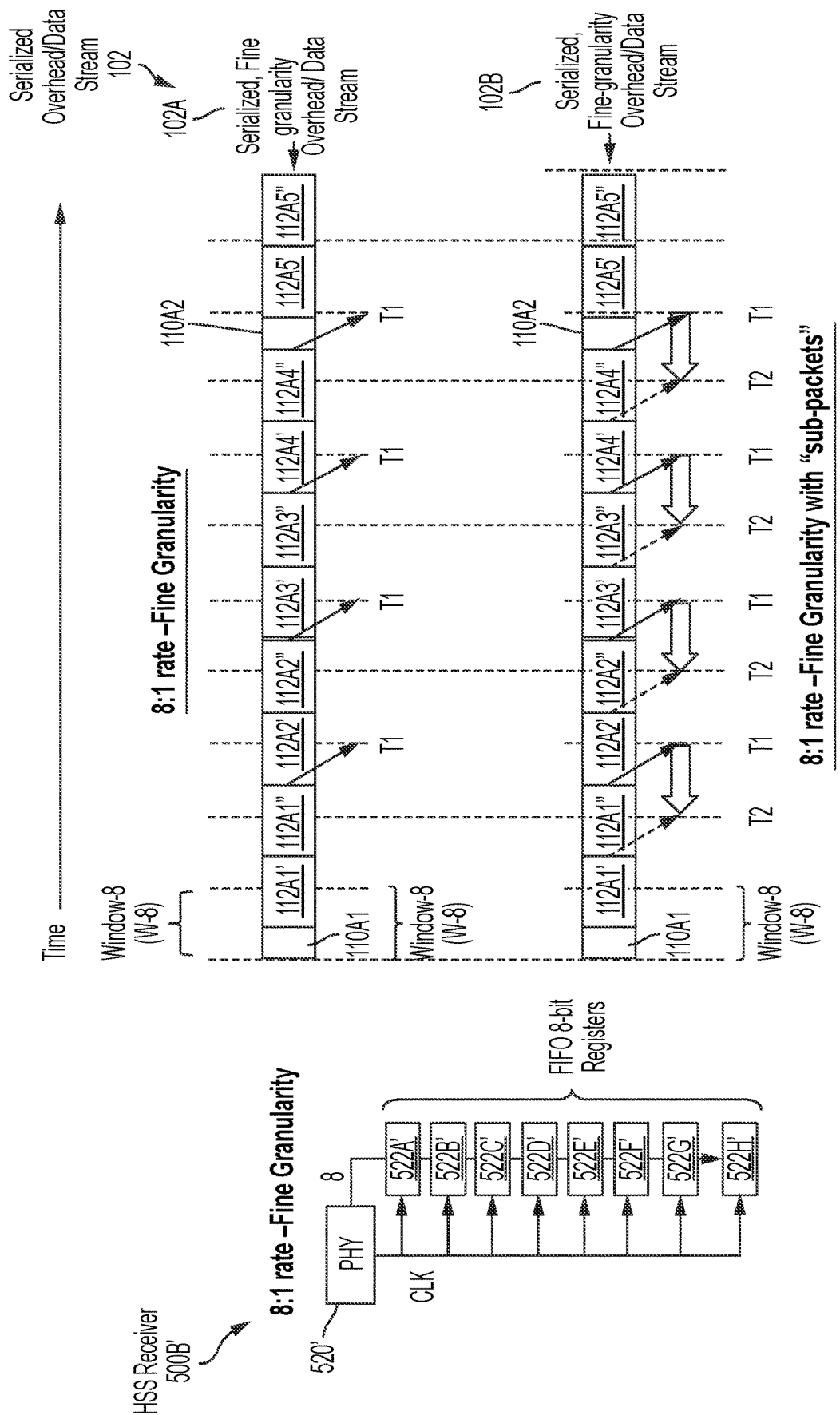

Defective Lane Compensation Degrade Comparison

| Degrade Support | RAS | Relative Area | Performance Impact | |
|---|---|---|---|---|
| | | | Bandwidth | Latency |
| None | NONE | N/A | N/A | N/A |
| Spare Lane Reserved | GOOD | +544 | -6% all interfaces<br>-6% for bad lane | Slight Circuit Delay |
| Read like a book | GOOD | +9792 | 0 all interfaces<br>-6% for bad lane | Moderate Circuit Delay<br>Many 18:1 |
| Ripple Degrade | GOOD | +1360 | 0 all interfaces<br>-6% for bad lane | Moderate Circuit Delay<br>Single 18:1 |
| Wave Degrade | GOOD | +1088 | 0 all interfaces<br>-6% for bad lane | Slight Circuit Delay |

No defective lane(s)

| Lane-> Beat V | 0 | 1 | 2 | 3 | 4 | 5 | 6 | 7 | 8 | 9 | 10 | 11 | 12 | 13 | 14 | 15 | 16 | 17 | RCV DATA: |
|---|---|---|---|---|---|---|---|---|---|---|---|---|---|---|---|---|---|---|---|
| 0 | A0 | A1 | A2 | A3 | A4 | A5 | A6 | A7 | A8 | A9 | A10 | A11 | A12 | A13 | A14 | A15 | A16 | A17 | A |
| 1 | B0 | B1 | B2 | B3 | B4 | B5 | B6 | B7 | B8 | B9 | B10 | B11 | B12 | B13 | B14 | B15 | B16 | B17 | B |
| 2 | C0 | C1 | C2 | C3 | C4 | C5 | C6 | C7 | C8 | C9 | C10 | C11 | C12 | C13 | C14 | C15 | C16 | C17 | C |
| 3 | D0 | D1 | D2 | D3 | D4 | D5 | D6 | D7 | D8 | D9 | D10 | D11 | D12 | D13 | D14 | D15 | D16 | D17 | D |
| 4 | E0 | E1 | E2 | E3 | E4 | E5 | E6 | E7 | E8 | E9 | E10 | E11 | E12 | E13 | E14 | E15 | E16 | E17 | E |
| 5 | F0 | F1 | F2 | F3 | F4 | F5 | F6 | F7 | F8 | F9 | F10 | F11 | F12 | F13 | F14 | F15 | F16 | F17 | F |
| 6 | G0 | G1 | G2 | G3 | G4 | G5 | G6 | G7 | G8 | G9 | G10 | G11 | G12 | G13 | G14 | G15 | G16 | G17 | G |
| 7 | H0 | H1 | H2 | H3 | H4 | H5 | H6 | H7 | H8 | H9 | H10 | H11 | H12 | H13 | H14 | H15 | H16 | H17 | H |
| 8 | I0 | I1 | I2 | I3 | I4 | I5 | I6 | I7 | I8 | I9 | I10 | I11 | I12 | I13 | I14 | I15 | I16 | I17 | I |
| 9 | J0 | J1 | J2 | J3 | J4 | J5 | J6 | J7 | J8 | J9 | J10 | J11 | J12 | J13 | J14 | J15 | J16 | J17 | J |
| 10 | K0 | K1 | K2 | K3 | K4 | K5 | K6 | K7 | K8 | K9 | K10 | K11 | K12 | K13 | K14 | K15 | K16 | K17 | K |
| 11 | L0 | L1 | L2 | L3 | L4 | L5 | L6 | L7 | L8 | L9 | L10 | L11 | L12 | L13 | L14 | L15 | L16 | L17 | L |
| 12 | M0 | M1 | M2 | M3 | M4 | M5 | M6 | M7 | M8 | M9 | M10 | M11 | M12 | M13 | M14 | M15 | M16 | M17 | M |
| 13 | N0 | N1 | N2 | N3 | N4 | N5 | N6 | N7 | N8 | N9 | N10 | N11 | N12 | N13 | N14 | N15 | N16 | N17 | N |
| 14 | O0 | O1 | O2 | O3 | O4 | O5 | O6 | O7 | O8 | O9 | O10 | O11 | O12 | O13 | O14 | O15 | O16 | O17 | O |
| 15 | P0 | P1 | P2 | P3 | P4 | P5 | P6 | P7 | P8 | P9 | P10 | P11 | P12 | P13 | P14 | P15 | P16 | P17 | P |
| 16 | Q0 | Q1 | Q2 | Q3 | Q4 | Q5 | Q6 | Q7 | Q8 | Q9 | Q10 | Q11 | Q12 | Q13 | Q14 | Q15 | Q16 | Q17 | Q |
| 17 | R0 | R1 | R2 | R3 | R4 | R5 | R6 | R7 | R8 | R9 | R10 | R11 | R12 | R13 | R14 | R15 | R16 | R17 | R |

FIG. 7

Low-latency defective lane compensation - "Read like a book"

| Lane->2:1 cycle V | DRV | 0 | 1 | 2 | 3 | 4 | 5 | 6 | 7 | 8 | 9 | 10 | 11 | 12 | 13 | 14 | 15 | 16 | RCV |
|---|---|---|---|---|---|---|---|---|---|---|---|---|---|---|---|---|---|---|---|
| 0 | A | A0 | A1 | A2 | A3 | A4 | A5 | A6 | A7 | A8 | A9 | A10 | A11 | A12 | A13 | A14 | A15 | A16 | Gap |
| 1 | B | A17 | B0 | B1 | B2 | B3 | B4 | B5 | B6 | B7 | B8 | B9 | B10 | B11 | B12 | B13 | B14 | B15 | A |
| 2 | C | B16 | B17 | C0 | C1 | C2 | C3 | C4 | C5 | C6 | C7 | C8 | C9 | C10 | C11 | C12 | C13 | C14 | B |
| 3 | D | C15 | C16 | C17 | D0 | D1 | D2 | D3 | D4 | D5 | D6 | D7 | D8 | D9 | D10 | D11 | D12 | D13 | C |
| 4 | E | D14 | D15 | D16 | D17 | E0 | E1 | E2 | E3 | E4 | E5 | E6 | E7 | E8 | E9 | E10 | E11 | E12 | D |
| 5 | F | E13 | E14 | E15 | E16 | E17 | F0 | F1 | F2 | F3 | F4 | F5 | F6 | F7 | F8 | F9 | F10 | F11 | E |
| 6 | G | F12 | F13 | F14 | F15 | F16 | F17 | G0 | G1 | G2 | G3 | G4 | G5 | G6 | G7 | G8 | G9 | G10 | F |
| 7 | H | G11 | G12 | G13 | G14 | G15 | G16 | G17 | H0 | H1 | H2 | H3 | H4 | H5 | H6 | H7 | H8 | H9 | G |
| 8 | I | H10 | H11 | H12 | H13 | H14 | H15 | H16 | H17 | I0 | I1 | I2 | I3 | I4 | I5 | I6 | I7 | I8 | H |
| 9 | J | I9 | I10 | I11 | I12 | I13 | I14 | I15 | I16 | I17 | J0 | J1 | J2 | J3 | J4 | J5 | J6 | J7 | I |
| 10 | K | J8 | J9 | J10 | J11 | J12 | J13 | J14 | J15 | J16 | J17 | K0 | K1 | K2 | K3 | K4 | K5 | K6 | J |
| 11 | L | K7 | K8 | K9 | K10 | K11 | K12 | K13 | K14 | K15 | K16 | K17 | L0 | L1 | L2 | L3 | L4 | L5 | K |
| 12 | M | L6 | L7 | L8 | L9 | L10 | L11 | L12 | L13 | L14 | L15 | L16 | L17 | M0 | M1 | M2 | M3 | M4 | L |
| 13 | N | M5 | M6 | M7 | M8 | M9 | M10 | M11 | M12 | M13 | M14 | M15 | M16 | M17 | N0 | N1 | N2 | N3 | M |
| 14 | O | N4 | N5 | N6 | N7 | N8 | N9 | N10 | N11 | N12 | N13 | N14 | N15 | N16 | N17 | O0 | O1 | O2 | N |
| 15 | P | O3 | O4 | O5 | O6 | O7 | O8 | O9 | O10 | O11 | O12 | O13 | O14 | O15 | O16 | O17 | P0 | P1 | O |
| 16 | Q | P2 | P3 | P4 | P5 | P6 | P7 | P8 | P9 | P10 | P11 | P12 | P13 | P14 | P15 | P16 | P17 | Q0 | P |
| 17 | Gap | Q1 | Q2 | Q3 | Q4 | Q5 | Q6 | Q7 | Q8 | Q9 | Q10 | Q11 | Q12 | Q13 | Q14 | Q15 | Q16 | Q17 | Q |

FIG. 8

Low-latency defective lane degrade compensation - Ripple Degrade

| Lane-> 2:1 cycle V | DRV | 0 | 1 | 2 | 3 | 4 | 5 | 6 | 7 | 8 | 9 | 10 | 11 | 12 | 13 | 14 | 15 | 16 | RCV |
|---|---|---|---|---|---|---|---|---|---|---|---|---|---|---|---|---|---|---|---|
| 0 | A | A0 | A1 | A2 | A3 | A4 | A5 | A6 | A7 | A8 | A9 | A10 | A11 | A12 | A13 | A14 | A15 | A16 | Gap |
| 1 | B | A17 | B1 | B2 | B3 | B4 | B5 | B6 | B7 | B8 | B9 | B10 | B11 | B12 | B13 | B14 | B15 | B16 | A |
| 2 | C | B0 | B17 | C2 | C3 | C4 | C5 | C6 | C7 | C8 | C9 | C10 | C11 | C12 | C13 | C14 | C15 | C16 | B |
| 3 | D | C0 | C1 | C17 | D3 | D4 | D5 | D6 | D7 | D8 | D9 | D10 | D11 | D12 | D13 | D14 | D15 | D16 | C |
| 4 | E | D0 | D1 | D2 | D17 | E4 | E5 | E6 | E7 | E8 | E9 | E10 | E11 | E12 | E13 | E14 | E15 | E16 | D |
| 5 | F | E0 | E1 | E2 | E3 | E17 | F5 | F6 | F7 | F8 | F9 | F10 | F11 | F12 | F13 | F14 | F15 | F16 | E |
| 6 | G | F0 | F1 | F2 | F3 | F4 | F17 | G6 | G7 | G8 | G9 | G10 | G11 | G12 | G13 | G14 | G15 | G16 | F |
| 7 | H | G0 | G1 | G2 | G3 | G4 | G5 | G17 | H7 | H8 | H9 | H10 | H11 | H12 | H13 | H14 | H15 | H16 | G |
| 8 | I | H0 | H1 | H2 | H3 | H4 | H5 | H6 | H17 | I8 | I9 | I10 | I11 | I12 | I13 | I14 | I15 | I16 | H |
| 9 | J | I0 | I1 | I2 | I3 | I4 | I5 | I6 | I7 | I17 | J9 | J10 | J11 | J12 | J13 | J14 | J15 | J16 | I |
| 10 | K | J0 | J1 | J2 | J3 | J4 | J5 | J6 | J7 | J8 | J17 | K10 | K11 | K12 | K13 | K14 | K15 | K16 | J |
| 11 | L | K0 | K1 | K2 | K3 | K4 | K5 | K6 | K7 | K8 | K9 | K17 | L11 | L12 | L13 | L14 | L15 | L16 | K |
| 12 | M | L0 | L1 | L2 | L3 | L4 | L5 | L6 | L7 | L8 | L9 | L10 | L17 | M12 | M13 | M14 | M15 | M16 | L |
| 13 | N | M0 | M1 | M2 | M3 | M4 | M5 | M6 | M7 | M8 | M9 | M10 | M11 | M17 | N13 | N14 | N15 | N16 | M |
| 14 | O | N0 | N1 | N2 | N3 | N4 | N5 | N6 | N7 | N8 | N9 | N10 | N11 | N12 | N17 | O14 | O15 | O16 | N |
| 15 | P | O0 | O1 | O2 | O3 | O4 | O5 | O6 | O7 | O8 | O9 | O10 | O11 | O12 | O13 | O17 | P15 | P16 | O |
| 16 | Q | P0 | P1 | P2 | P3 | P4 | P5 | P6 | P7 | P8 | P9 | P10 | P11 | P12 | P13 | P14 | P17 | Q16 | P |
| 17 | Gap | Q0 | Q1 | Q2 | Q3 | Q4 | Q5 | Q6 | Q7 | Q8 | Q9 | Q10 | Q11 | Q12 | Q13 | Q14 | Q15 | Q17 | Q |

Low-latency defective lane compensation HW – Area Comparison
Read like a book
BW: 17 packets in 18 cycles.
Total Area:
272 x 18:1 [17]= 4624
288 x 2:1 [1] = 288
272 x 2:1 [1] = 272
288 x 17:1 [16] = 4608
9792 2:1 data MUXs
Ripple degrade
BW: 17 packets in 18 cycles.
Total Area:
272 x 2:1 [1]= 272
288 x 2:1 [1] = 288
272 x 2:1 [1] = 272
272 x 2:1 [1] = 272
16 x 17:1 [16] = 256
1360 2:1 data MUXs
Wave degrade
BW: 17 packets in 18 cycles.
Total Area:
272 x 2:1 [1]= 272
288 x 2:1 [1] = 288
272 x 2:1 [1] = 272
256 x 2:1 [1] = 256
1088 2:1 data MUXs
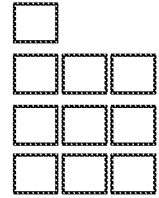
FIG. 11

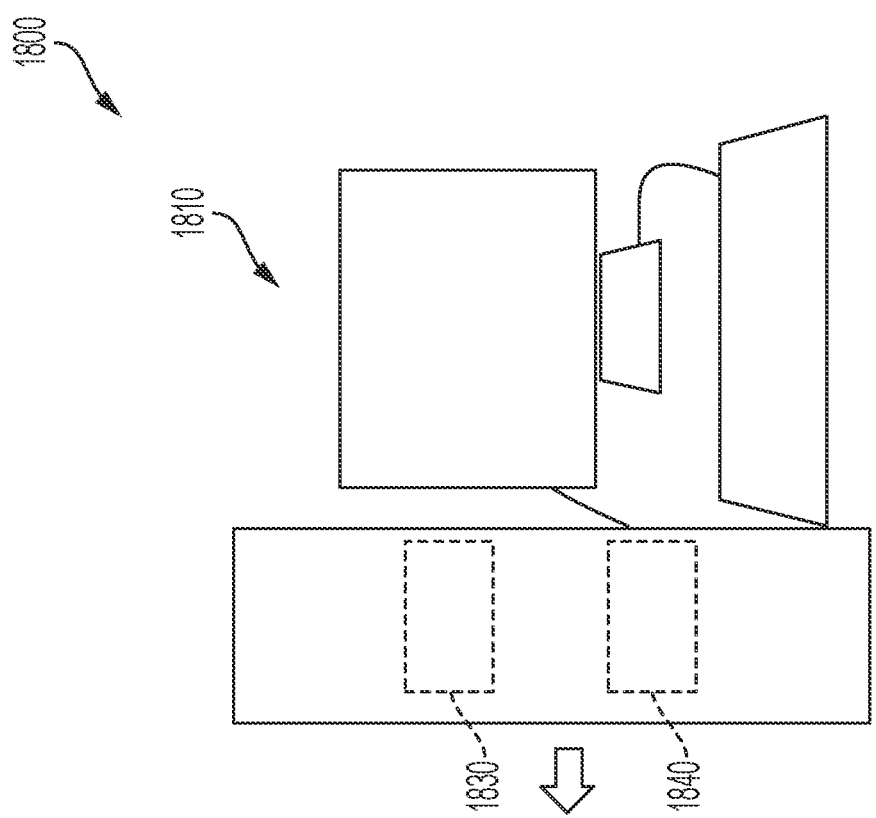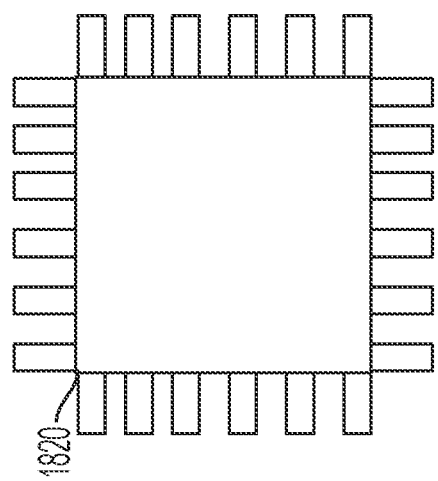
FIG. 18

LOW-LATENCY, HIGH-AVAILABILITY AND HIGH-SPEED SERDES INTERFACE HAVING MULTIPLE SYNCHRONIZATION MODES

BACKGROUND

The present invention relates in general to processor-based circuitry used in networked communications systems. More specifically, the present invention relates to computing systems, computer-implemented methods, and computer program products that implement low-latency, high-availability, and high-speed serialized/deserialized interfaces configured to provide novel synchronization functionality that enables the dynamic transition between a multiplicity of synchronization modes, including, for example, synchronous, mesochronous, plesiochronous, and asynchronous.

The term "mainframe" is used to describe a category of computers tasked with performing high-speed transaction processing. Mainframes are high-performance computers with large amounts of memory and processors that support thousands of applications and I/O (input/output) devices to simultaneously process billions of simple calculations and transactions that serve thousands of users in real time. The mainframe is used extensively in commercial databases, transaction servers, and applications that require high reliability, availability, and serviceability (or "RAS"). Computer systems designed with higher levels of RAS have many features that protect data integrity and help them stay available for long periods of time without failure. Ideally, RAS is a central design feature of all aspects of a computer system, including the application programs. In RAS, a system having high "reliability" means, inter alia, that the system's hardware components have extensive self-checking and self-recovery capabilities. The system's software reliability typically results from extensive testing and the ability to make quick updates for detected problems. A system having high "availability" means, inter alia, that the system can recover from a failed component (hardware or software) without impacting the rest of the running system. Hardware recovery can include the automatic replacement of failed elements with spares. Software recovery can include the layers of error recovery that are provided by the operating system. A system having high "serviceability" means the system can determine why a failure occurred. Serviceability enables the replacement of hardware and software elements while impacting the operational system as little as possible. Serviceability also implies well-defined units of replacement, either hardware or software.

In mainframes, high-speed communications are facilitated by incorporating serializer/deserializer (SerDes) hardware and software into the bus interfaces. SerDes interfaces facilitate high-speed communications by converting parallel data transmissions to serial data transmissions (and vice versa) in either direction across the interface. System architectures such PCI express (PCIe) increase data transmission speed by utilizing high-speed SerDes (HSS) links to transmit data packets from a transmitter across a differential or single line to a receiver. An HSS can be either a stand-alone device or, in most cases, an IP core integrated into a serial bus controller or an ASIC (application specific integrated circuit). HSS interface circuitry solves the timing skew problem encountered in a parallel bus by embedding the clock signal into the data stream. Included among the SerDes functions are embedded clock and clock-recovery circuitry, which are needed to create the high-speed serial data path. This path can be across a printed circuit board (PCB), a backplane with multiple PCBs, or through cabling connected to another equipment shelf. At the receive end of the path, a clock-and-data-recovery circuit receives the signal and extracts a properly timed clock bit from the data flow. The data signal is then deserialized down to a lower speed parallel data interface, and the parallel data is clock-aligned to a local system clock.

In HSS interface circuitry, because there is no separate clock signal in the serial bus, the serial bus can usually operate at a much higher data rate than a parallel bus in a comparable system environment. For example, the PCIe HSS architecture specifies a serial data rate of 2.5 Gb/s, which translates into a bit period of just 400 ps. In scalable multiprocessor (SMP) designs, HSS interfaces also have the effect of reducing the number of I/O pins and connections required on a given processor chip. For example, HSS interfaces can be used to reduce a wide internal processor chip bus (e.g., 16 parallel pins) to a single serialized line, thereby achieving a 16:1 reduction in the processor chip's I/O. Because the off-chip interface can run 16 times faster, there are no significant bandwidth bottlenecks at these interfaces.

The timing or coordination of data transmission/reception operations in HSS interfaces can be categorized as synchronous, plesiochronous, mesochronous, or asynchronous. As used herein, synchronous transmission/reception is characterized by using the same clock (frequency and phase) to coordinate data transmission operations at the sender with data latching operations at the receiver. As used herein, plesiochronous, mesochronous, and asynchronous transmissions are characterized by differences (frequency and/or phase) between the clock timing at the sender and the clock timing at the receiver. In a plesiochronous operation mode, the sender and receiver clocks have approximately the same frequency but are not precisely the same frequency. In mesochronous operation mode, the sender and receiver clocks are at the same exact frequency but are out of alignment because they do not have the same phase. As the term "asynchronous" is used herein, asynchronous operation mode is when the sender and receiver clock frequencies are significantly different. In some instances, "asynchronous mode" refers to a mode that is not "synchronous" and not "mesochronous" (i.e., it could be "asynchronous" but it could also provide for the operation of the interface in "plesiochronous" or near frequency cases).

On the surface, HSS performs two seemingly simple functions, namely serialization and desserialization. However, performing these two simple functions well at a multi-gigabit speed in a lossy and noisy environment places additional burdens on the HSS architecture to synchronize the reception of valid serialized data without significantly degrading RAS. The important considerations for achieving RAS in an HSS architecture include, for example, the system-level requirements placed on the HSS interface; the HSS clock generation and distribution scheme; and the latency performance of the HSS receiver circuitry that latches and deserializes the received data.

In general, the clock signals generated by a clock generation and distribution scheme are used to coordinate or synchronize the actions of two or more circuits, including, for example, coordinating data transmissions between a transmitter and a receiver. The clock signal oscillates between a high and a low state with a selected duty cycle (e.g., a 50% duty cycle) and is usually a square wave. The clock signal effectively defines when a circuit (e.g., a transmitter or receiver) performs an operation or instruction. A clock cycle can be defined as the high-low-high transition of the clock signal, and the various operations or functions performed under control of the clock signal can be evaluated in terms of the number of clock cycles the operation or function takes to complete. For example, one processor can take one clock cycle to move data from one register to another, but a different processor can take two clock cycles to perform the same operation.

The latency performance of an HSS system is impacted by various aspects of the design and operations of the HSS transmitter and receiver. In general, latency is a measure of delay and can be characterized as one-way latency or round-trip latency. One-way latency measures the time it takes for transmitted data to arrive at its destination. Round trip latency measures the time it takes for transmitted data (e.g., a request) to arrive at its destination plus the time it takes for related data/information (e.g., a response to the request) to return to the transmitter. Latency can be measured in clock cycles.

Thus, although HSS interfaces provide benefits (e.g., higher data transfer speed and I/O pin reduction), it is a challenge to develop HSS synchronization circuitry that maintains desired performance parameters (e.g., low latency, strong RAS characteristics, and the like) across a variety of operating conditions. Such operating conditions can include frequency and/or phase differences between the sender's clock timing and the receiver's clock timing, as well as a variety of failure modes that result from, for example, switching from one clock source to another, and/or one or more defective transmission lines/lanes. Maintaining desired operating parameters is also negatively impacted by the extra overhead included with transmitted data packets in HSS interfaces. This overhead can cause transmitted HSS data to be received across multiple cycles. More specifically, because of the extra overhead for HSS data packets (including frame headers, sequence numbers, cyclic redundancy check (CRC) protection, and tags), a latency penalty occurs because a transmitted packet is no longer guaranteed to arrive at its receiver destination entirely on a synchronized, on-chip cycle boundary. Some data of the transmitted packet will arrive early while other data of the transmitted packet can arrive one or two cycles later. This latency penalty is present even if there are no interface errors, bad lanes, replays, and the like. In a highly integrated SMP, the lost performance caused by such latency penalties can be as high as 1-2% of system performance.

SUMMARY

Embodiments of the invention are directed to a computer-implemented method of automatically determining an operation mode of a data transmission system. The data transmission system includes a transmitter and a receiver. The computer-implemented method includes using the transmitter to send data from the transmitter through a plurality of lanes to the receiver using a synchronous operation mode. In aspects of the invention, the synchronous operation mode includes sending the data from the transmitter through the plurality of lanes to the receiver in a synchronous transmission manner that relies on an alignment between a transmitter clock frequency and a receiver clock frequency. A synchronous operation performance analysis (SOPA) is performed on the data transmission system while the data transmission system is operating in the synchronous operation mode. The computer-implemented method switches the data transmission system from the synchronous operation mode to an asynchronous operation mode based on at least in part on a result of performing the SOPA. The asynchronous operation mode includes sending the data from the transmitter through the plurality of lanes to the receiver without requiring alignment between the transmitter clock frequency and the receiver clock frequency.

In some aspects of the invention, the above-described computer-implemented method further includes performing an asynchronous operation performance analysis (AOPA) on the data transmission system while the data transmission system is operating in the asynchronous operation mode. In some embodiments of the invention, the data transmission system is switched from the asynchronous operation mode to the synchronous operation mode based at least in part on a result of performing the AOPA.

In some aspects of the invention, the above-described computer-implemented method includes performing a diagnosis of the transmitter, the plurality of lanes, and the receiver based at least in part on a result of a comparison between the AOPM and an AOPM error threshold.

The above-describe aspects of the invention provide technical effects and benefits. For example, the automated synchronization modes functionality disclosed herein allows an HSS system to continue operating when failure modes occur that no longer allow the HSS system to serialize, transmit, and deserialize data synchronously. More specifically, the automated synchronization modes functionality is configured to, automatically, switch the HSS system to a non-synchronous operating mode when it is determined that there is some issue that is preventing the HSS system from operating synchronously, then automatically return the HSS system to synchronous operation mode when it is determined that there is no longer an issue preventing the HSS system from operating synchronously. The automated synchronization modes functionality further includes diagnosis functionality that allows it to diagnose the source of the non-synchronous operation, and some portions of the diagnosis are not performed until after the HSS system is in a non-synchronous operation mode. Performing the diagnosis while the HSS system is operating in a non-synchronous mode is beneficial in that the complexity of both the diagnosis and any problem-mitigation strategies (e.g., defective lane compensation) that are invoked is greatly reduced when the HSS system is operating in a non-synchronous mode.

Embodiments of the invention are also directed to computer systems and computer program products having substantially the same features, technical effects, and technical benefits as the computer-implemented methods described above.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 5C depicts a block diagram illustrating a fine-granularity deserialization function with sub-packet reorganization in accordance with embodiments of the invention;

FIG. 5D depicts a timing diagram illustrating a fine-granularity deserialization function with sub-packet reorganization in accordance with embodiments of the invention;

FIG. 6 depicts a table that summarizes performance comparisons of various defective lane compensation functionality, including defective lane compensation functionality in accordance with embodiments of the invention;

FIG. 7 depicts a diagram illustrating a more detailed example of how a low-latency HSS receiver receives serialized data when no lanes are degraded;

FIG. 8 depicts a diagram illustrating a more detailed example of how a low-latency HSS receiver reroutes serialized data in accordance with embodiments of the invention when one or more lanes are degraded;

FIG. 9 depicts a diagram illustrating a more detailed example of how a low-latency HSS receiver reroutes serialized data in accordance with embodiments of the invention when one or more lanes are degraded;

FIG. 11 is a diagram illustrating a comparison of hardware implementations of the rerouting techniques shown in FIGS. 8, 9, and 10 in accordance with embodiments of the invention;

FIG. 18 depicts a block diagram of a system capable of implementing embodiments of the invention.

Figure 1:
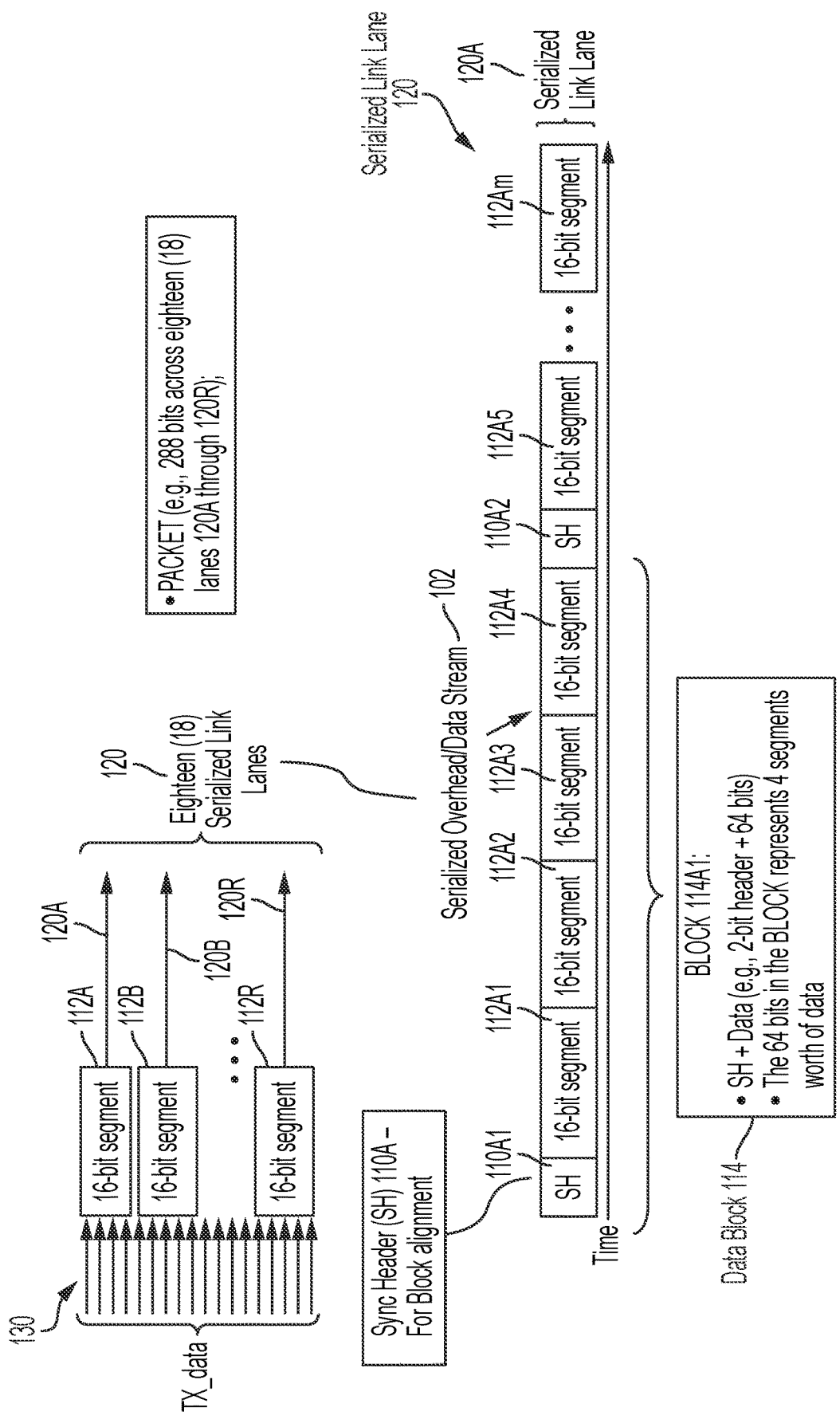
FIG. 1 depicts a block diagram illustrating a non-limiting example of a suitable data structure for serialized data that can be transmitted by a low-latency high-availability high-speed SerDes (HSS) system in accordance with embodiments of the invention.

In the accompanying figures and following detailed description of the disclosed embodiments, the various elements illustrated in the figures are provided with three or four digit reference numbers. In some instances, the leftmost digits of each reference number corresponds to the figure in which its element is first illustrated.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Many of the functional units of the systems described in this specification have been labeled as modules. Embodiments of the invention apply to a wide variety of module implementations. For example, a module can be implemented as a hardware circuit including custom VLSI circuits or gate arrays, off-the-shelf semiconductors such as logic chips, transistors, or other discrete components. A module can also be implemented in programmable hardware devices such as field programmable gate arrays, programmable array logic, programmable logic devices or the like. Modules can also be implemented in software for execution by various types of processors. An identified module of executable code can, for instance, include one or more physical or logical blocks of computer instructions which can, for instance, be organized as an object, procedure, or function. Nevertheless, the executables of an identified module need not be physically located together but can include disparate instructions stored in different locations which, when joined logically together, function as the module and achieve the stated purpose for the module.

The various components, modules, sub-function, and the like of the systems illustrated herein are depicted separately for ease of illustration and explanation. In embodiments of the invention, the operations performed by the various components, modules, sub-functions, and the like can be distributed differently than shown without departing from the scope of the various embodiments of the invention described herein unless it is specifically stated otherwise.

For convenience, some of the technical operations described herein are conveyed using informal expressions. For example, a processor that has data stored in its cache memory can be described as the processor "knowing" the data. Similarly, a user sending a load-data command to a processor can be described as the user "telling" the processor to load data. It is understood that any such informal expressions in this detailed description should be read to cover, and a person skilled in the relevant art would understand such informal expressions to cover, the informal expression's corresponding more formal and technical function and operation.

Turning now to an overview of aspects of the invention, embodiments of the invention described herein provide computing systems, computer-implemented methods, and computer program products that implement low-latency, high-availability, and high-speed serialized/deserialized interfaces configured to provide novel synchronization functionality that enables the dynamic transition between a multiplicity of synchronization modes, including, for example, synchronous, mesochronous, plesiochronous, and asynchronous. Embodiments of the invention provide automated synchronization modes functionality that enables an HSS system to continue operating (i.e., successfully transmitting and receiving serialized data) when failure modes occur that no longer allow the HSS system to serialize, transmit, and deserialize data synchronously. More specifically, the automated synchronization modes functionality is configured to, automatically, switch the HSS system to a non-synchronous operating mode when it is determined that there is some issue that is preventing the HSS system from operating synchronously, then automatically return the HSS system to synchronous operation mode when it is determined that there is no longer an issue preventing the HSS system from operating synchronously. The automated synchronization modes functionality further includes diagnosis functionality that allows it to diagnose the source of the non-synchronous operation. In accordance with aspects of the invention, the diagnosis is not performed until after the HSS system is in a non-synchronous operation mode. Performing the diagnosis while the HSS system is operating in a non-synchronous mode is beneficial in that the complexity of both the diagnosis and any problem-mitigation strategies (e.g., defective lane compensation) that are invoked is greatly reduced when the HSS system is operating in a non-synchronous mode.

Embodiments of the invention described herein further provide computing systems, computer-implemented methods, and computer program products that implement low-latency high-speed serialized/deserialized data transmissions configured to deserializer received data using novel latency-reducing fine granularity deserialization techniques, as well as novel defective-lane data restructuring techniques that compensate for the unexpected presence of one or more defective transmission lanes. In accordance with aspects of the invention, the fine-granularity deserialization functionality utilizes a data deserialization ratio that is more granular (e.g., an 8:1 deserialization ratio) than the serialization ratio (e.g., a 16:1 serialization ratio). Accordingly, the fine-granularity deserialization function enables the deserializer of the HSS system to load and use deserialized data sooner, which improves latency performance of the HSS system. In some aspects of the invention, the fine-granularity FIFO structure and register loading logic of the HSS system's receiver can be augmented by also providing a sub-packet reorganization function that can be configured to place a data stream on a link lane connecting the transmitter and the receiver of the HSS system in "sub-packets" or "action groups," wherein the segments that form the action group are in sequential order in the data stream. Because the action group segments are in sequential order, they can be concentrated at the leading end of the FIFO registers so the HSS system only has to wait until the leading FIFO registers are full with the action group segments before the action group segments can be sampled and used.

In embodiments of the invention, the defective lane compensation circuitry enables an HSS system to continue operating (i.e., successfully transmitting and receiving serialized data) when failure modes occur that no longer allow the HSS system to serialize, transmit, and deserialize data synchronously due to a lane degrade event. In accordance with embodiments of the invention, the defective lane compensation circuits implement various novel techniques for rerouting transmitted/received data when an instance of the various data transmission lanes of the HSS system malfunctions and no longer transmits data. Rather than provide wasteful spare lanes and/or spare cycles that remain idle until a transmission lane malfunctions, the defective lane compensation circuitry in accordance with embodiments of the invention utilize data re-routing logic that enables the functioning lanes to transmit data that has been re-routed from the defective lane, thereby enabling the functioning transmission lanes to process more data than they were originally designed to process.

Turning now to a more detailed description of various embodiments of the invention, FIG. 1 depicts a block diagram illustrating a non-limiting example of a suitable data structure for serialized overhead/data 102 that can be generated and transmitted by a low-latency high-availability high-speed SerDes (HSS) system 200, 300 (shown in FIGS. 2 and 3A) and transmitted over a serialized link lane(s) 120 in accordance with embodiments of the invention. The data structures described and illustrated in this detailed description are non-limiting in that they are illustrative examples, and it will be understood by those skilled in the relevant arts that embodiments of the invention can be used with a wide variety of data structures. FIG. 1 depicts Tx_data, which consists of a parallel bus 130, having "n" lanes, where "n" is an alphabet letter (or letters, e.g., AA) corresponding to a whole number. In the example depicted in FIG. 1, "n" is "R," which corresponds to the whole number eighteen (18). Thus, serialized link lanes 120A, 120B, etc. incremented through 120R would represent the 18 lanes. In some embodiments of the invention, serialized link lane 120A can be implemented as a single-ended lane (i.e. single wire connection). In some embodiments of the invention, serialized link lane 120A can be implemented as a differential lane (i.e. a pair of wires, coaxial wires, twisted pair, or other similar constructs, all of which are known to those in the art).

To provide a better understanding of various aspects of the invention described herein, the following definitions and descriptions are provided. A lane is a logical representation of a single data stream. A lane can be implemented as a simple wire (single-ended lane); a differential electrical connection; an optical connection; and/or in multiple other ways. A unit interval (UI) is the time taken in a lane or a data stream by each subsequent pulse (or symbol). An n-bit segment is a collection of n consecutive symbols over a specific n consecutive UIs. For instance, an 8-bit segment can consist of the following encoded states, in order: "1", "0", "0", "1", "1", "0", "1", "0", wherein the first "1" was sent on the first UI, the first "0" was sent on the second UI, the next "0" was sent on the third UI, and so forth. In some situations, a segment can be represented as a left-to-right string of values. For instance, a 16-bit segment can have a value of "0010001101011010" (left to right). In some embodiments of the invention, this same logical value of "0010001101011010" might be sent across a differential lane as "0010001101011010" on the "true" wire of the differential lane and as "1101110010100101" on the "compliment" wire of the differential lane.

Turning back to FIG. 1, for ease of illustration, one data segment instance is shown per serial link lane 120. In practice, each individual serial link lane 120A through 120n holds multiple separate instances of the data segments over time. For example, serialized link lane (also called a lane) 120A holds multiple different instances of data segment 112A (112A1, 112A2, etc.); lane 120B holds multiple different instances of data segment 112B (112B1, 112B2, etc.); and lane 120n holds multiple instances of data segment 112n (112n1, 112n2, etc.).

A serialization operation is used to build the serialized overhead/data stream 102 by generating overhead data in the form of a sync header (SH) 110 and placing the SH 110A1 on the serialized link lane 120A followed by data segments 112A1, 112A2, 112A3, 112A4 pulled sequentially from consecutive bit segments for bus 120A. Likewise, each of the other lanes, 120B through 120n, will have overhead data built in a similar manner.

The combination of a sync header (SH) 110A1 followed by data segments 112A1, 112A2, 112A3, 112A4 form a data block 114A1. In some embodiments of the invention, one sync header (SH) 110A1 is followed by four data segments 112A1 through 112A4. Some embodiments of the invention can have differing numbers of data segments between sync headers (110). In some embodiments of the invention, idle data segments are inserted when there are no transactional data to send. In some embodiments of the invention, control segments are sent in lieu of data segments. In some embodiments of the invention, controls are sent across multiple lanes at once and voting is used to capture the command, even in the presence of lane errors. Various other data configurations and variations can be utilized without departing from the scope of the various embodiments of the invention described herein.

In the data structure example depicted in FIG. 1, the SH 110A1, is two-bits (2-bits), each data segment 112A1-112A4 is sixteen-bits (16-bits), and each data block 114A is a total of sixty-six-bits (66-bits). A new data block is commenced after data block 114A1 starting with SH 110A2 and followed by data segments 112A5 etc. Data blocks are placed on the serialized link lane 120 for an indefinite amount of time while the system is running. For a group of data, the last block transmitted in a period of time can be labeled as data segment m (for lane 120A, designated as data segment 112Am).

The serialization process continues with the deserialization phase. As the sync headers SH 110 are received, they are used to align the various data blocks 114 at the receiver. The data blocks 114 are then broken up into 16-bit segments (e.g., 112A1). As described subsequently herein, a serialization/deserialization process will include multiple serialized link lane instances 120A-120n of the serialized link lane 120.

Figure 2:
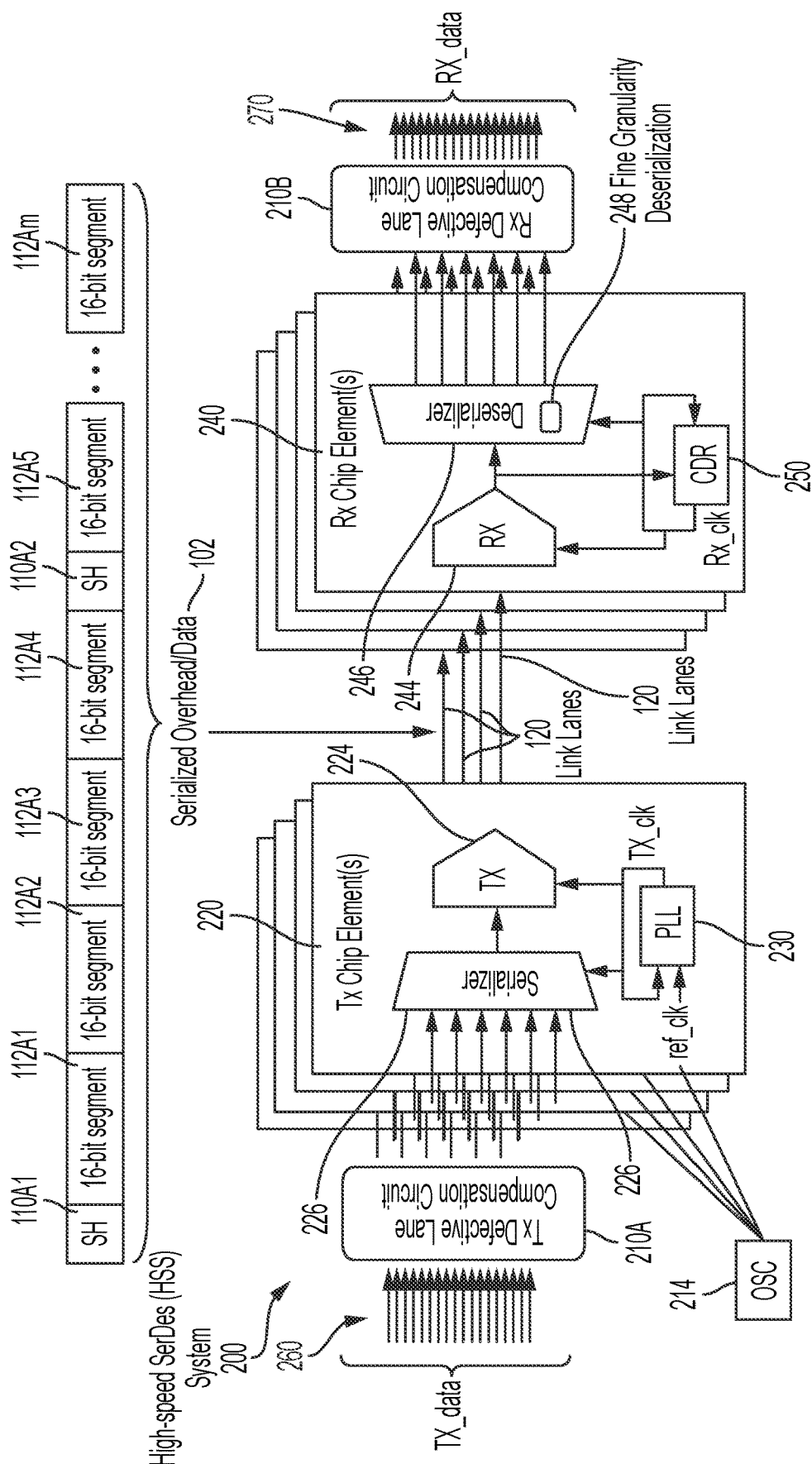
FIG. 2 depicts a block diagram illustrating a low-latency, high-availability HSS system in accordance with embodiments of the invention.

FIG. 2 depicts a block diagram illustrating a low-latency, high-availability high-speed SerDes (HSS) system 200 in accordance with embodiments of the invention. As described in greater detail subsequently herein, the HSS system 200 includes defective lane compensation circuitry 210A, 210B and fine-granularity deserialization functionality 248. In accordance with aspects of the invention, the fine-granularity deserialization functionality 248 utilizes a data deserialization ratio at the deserializer 246 that is more granular (e.g., an 8:1 deserialization ratio) than the serialization ratio (e.g., a 16:1 serialization ratio) used at the serializer 226. Accordingly, the fine-granularity deserialization function 248 enables the deserializer 246 to load and use deserialized data sooner, which improves latency performance of the HSS system 200. In accordance with embodiments of the invention, the defective lane compensation circuits 210A, 210B implement various novel techniques for rerouting transmitted/received data when an instance of the various data transmission lanes of the HSS system 200 malfunctions and no longer transmits data. Rather than provide wasteful spare lanes and/or spare cycles that remain idle until a transmission lane malfunctions, the defective lane compensation circuitry 210A, 210B in accordance with embodiments of the invention utilize data re-routing logic that enables the functioning lanes to transmit data that has been re-routed from the defective lane, thereby enabling the functioning transmission lanes to process data at the highest possible efficiency. As previously noted, additional details of the fine-granularity functionality 248 and the defective lane compensation circuitry 210A, 210B are described and illustrated subsequently herein.

Turning now to a description of the overall HSS system 200, the system 200 includes transmit (Tx) chip elements 220 and receive (Rx) chip elements 240, configured and arranged as shown. Multiple instances of the Tx chip element 220 are shown to convey that the Tx chip elements 220 process outputs from multiple driver-side parallel buses 260 to transmit multiple instances of the serialized overhead/data streams 102 over multiple instances of the link lanes 120. Similarly, multiple instances of the Rx chip element 220 are shown to convey that the Rx chip elements 220 process multiple instances of the serialized overhead/data streams 102 over multiple instance of the link lanes 120 deserialize the streams 102 into multiple receive-side parallel buses 270 for downstream processing. Accordingly, although one instance of each component of the Tx chip element 220 is illustrated, it is understood that other instances of the Tx chip element 220 will have corresponding components with corresponding functionality. Likewise, although one instance of each component of the Rx chip element 240 is illustrated, it is understood that other instances of the Rx chip element 240 will have corresponding components with corresponding functionality.

Referring still to FIG. 2, the Tx chip element 220 includes a serializer 226, a transmit (Tx) driver 224, and a phase lock loop (PLL) 230, configured and arranged as shown. An oscillator circuit 214 is communicatively coupled to the PLL 230 to provide a reference clock signal (ref_clk) to the PLL 230 so the PLL 230 can generate a transmit clock signal (Tx_clk) that is provided to the serializer 226 and the Tx driver 224 to control and time the serialization and driving operations of the Tx chip element 220. Tx_data, consisting of a transmit-side parallel bus 260, are passed through the novel defective lane compensation circuit 210A to the Tx chip element 220, which serializes the parallel data into the overhead/data stream(s) 102 and transmits the stream(s) 102 over the serial link lanes 120 to the Rx element(s) 240.

The Rx chip element 240 includes an Rx receiver 244, a deserializer 246, and a clock data recover (CDR) circuit 250, configured and arranged as shown. The Rx chip element 240 receives the overhead/data 102 over the serial link lanes 120. The Rx receiver 244 drives the overhead/data stream 102 to the deserializer 246 and the CDR circuit 250. To avoid the need to devote link lane capacity to transmitting the clock signal generated by the PLL 230 to the Rx chip element 240, the overhead/data stream 102 is driven over the serial link lane(s) 120 in a manner that allows the CDR circuit 250 to recover a receive clock signal (Rx_clk) from the stream 102 after it is received by the Rx receiver 244. Rx_clk is provided to the Rx receiver 244 and the deserializer 246 to control and time the driving and deserialization operations of the Rx chip element 240. The deserializer 246 generates deserialized (or parallel) data and passes the deserialized data through the novel Rx defective lane compensation circuit 210B to generate Rx_data, consisting of a receiver-side parallel bus 270 for downstream processing. Additional details of the Tx defective lane compensation circuit 210A and the Rx defective lane compensation circuit 210B are illustrated in FIGS. 6-12C and described subsequently herein. Additional details of the fine-granularity functionality (as well as sub-packet reorganization) are illustrated in FIGS. 5A-5D and described subsequently herein.

Figure 3A:
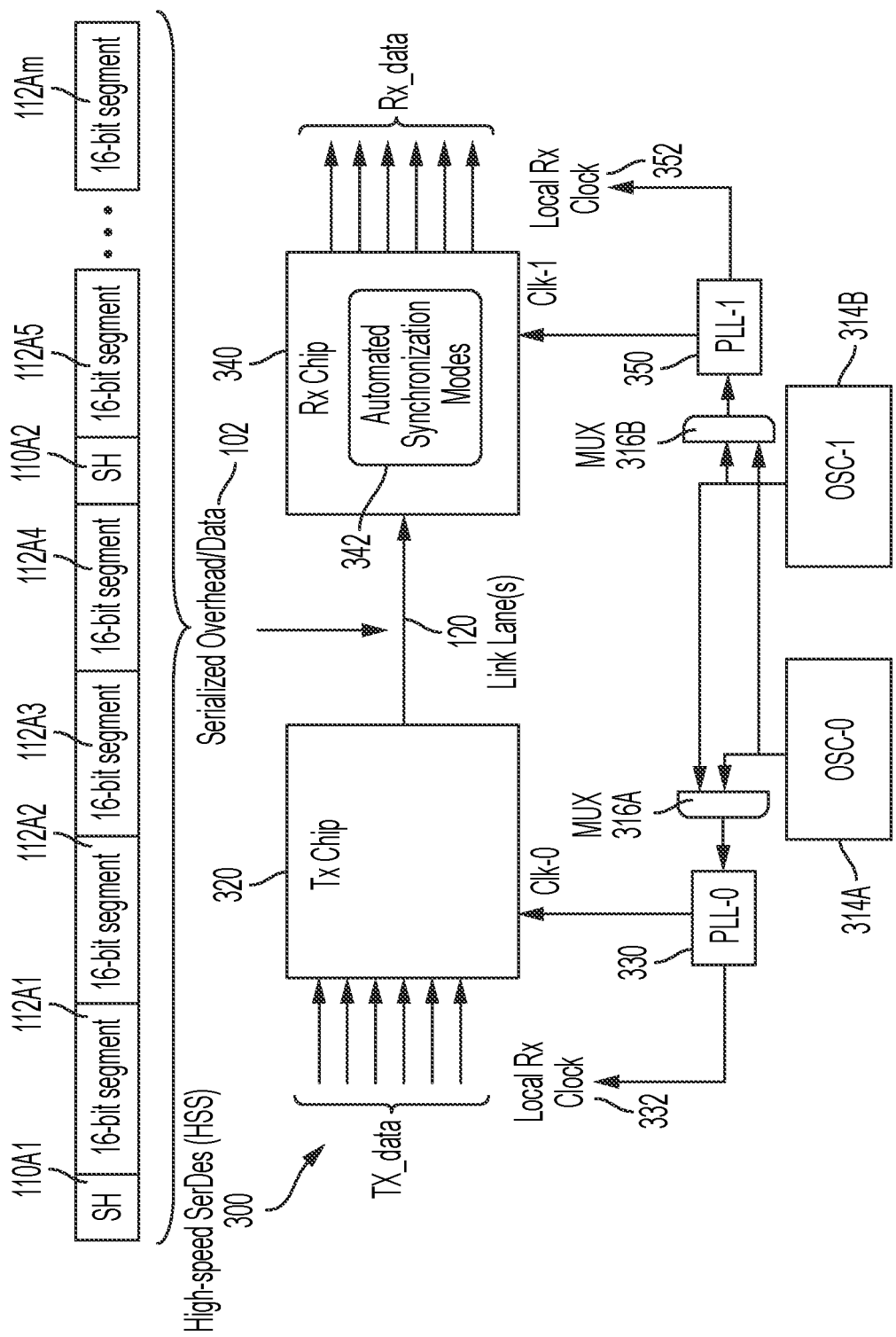
FIG. 3A depicts a block diagram illustrating a low-latency, high-availability HSS system in accordance with embodiments of the invention.

FIG. 3A depicts a block diagram illustrating a low-latency, high-availability HSS system 300 in accordance with embodiments of the invention. The overall HSS system 300 includes a transmit (Tx) chip 320 and a receive (Rx) chip 340 configured and arranged as shown. Unlike the depiction of the Tx chip element(s) 220 and the Rx chip element(s) 240 shown in FIG. 2, for ease of illustration and explanation the Tx chip 320 and the Rx chip 340 are each depicted in FIG. 3A as representing an entire chip. Accordingly, a single instance of the Tx_data, the serial link lane 120, the Rx-data, the PLL circuits 330, 350, the multiplexer (MUX) circuits 316A, 316B, and the oscillators 314A, 314B are shown. In some embodiments of the invention, Tx chip 320 and the Rx chip 340 include one or more instances of one or more of these elements. Additionally, the Tx chip 320 and the Rx chip 340 include circuitry to perform the serialization, transmit driver, receive driver, deserialization functions as utilized in the HSS system 200 (shown in FIG. 2). CDR functionality can also be provided at the Rx chip 340 depending on how the clock generation and distribution system of the HSS system 300 is designed. However, for ease of illustration and explanation, the elements that perform the previously-described functions are not shown separately in the HSS system 300 depicted in FIG. 3A. Further, although HSS systems 200 and HSS system 300 are shown separately, any feature described in one of the HSS systems 200, 300 can be provided in the other. For example, the automated synchronization mode functionality 342 can perform data traffic analysis that is used to shift synchronization operations from a synchronous operating mode to an asynchronous operating mode; diagnose that a lane degrade event has occurred; and initiate the defective lane compensation circuitry 210A, 210B (shown in FIG. 2) while the HSS system is operating in asynchronous mode.

As described in greater detail subsequently herein, the HSS system 300 includes novel automated synchronization mode functionality 342 configured and arranged to address the problem of maintaining system operation across a variety of operating conditions. Such operating conditions include the extra overhead (e.g., SH 110A, 110B) included with the overhead/data stream 102. This overhead can cause transmitted the overhead/data stream 102 to be received across multiple clock cycles. More specifically, because of the extra overhead (including frame headers, sequence numbers, cyclic redundancy check (CRC) protection, and tags), a latency penalty (i.e., latency increase) occurs because a data block 114A or segment (e.g., 16-bit segment 112A) is no longer guaranteed to arrive at its target locations of the Rx chip 340 entirely on a synchronized, on-chip cycle boundary. Some data of the transmitted stream 102 will arrive early while other data of the transmitted stream 102 can arrive one or two cycles later. This latency penalty is present even if there are no interface errors, bad lanes, replays, and the like. Accordingly, the novel automated synchronization mode functionality 342, in accordance with embodiments of the invention, enables the HSS system 300 to automatically detect the actual synchronization status of the data moving through the HSS system 300 and dynamically transition the HSS system 300 between (or among) a multiplicity of synchronization modes (e.g., synchronous, mesochronous, plesiochronous, and asynchronous) to match the actual synchronization status (or needs) of the system 300. Matching the synchronization mode to the actual synchronization status of the HSS system 300 mitigates the latency penalty that is imposed when the synchronization status of the HSS system 200 and the synchronization mode under which the HSS system 300 is operating do not match.

The automated synchronization circuitry 342 also enables the HSS system to continue operating when synchronous operation of the HSS system 300 is interrupted by failure scenarios that impact the clock generation circuitry of the HSS system 300. As depicted in FIG. 3A, the HSS system 300 utilizes clock generation circuitry that is redundant in that it includes oscillator-0 (OSC-0) 314A, PLL-0 330, oscillator-1 (OSC-1) 314B, PLL-1 350, a MUX 316A, and a MUX 316B, configured and arranged as shown. Under normal operation of the clock generation circuitry, MUX 316A and MUX 316B are configured and arranged to allow either OSC-0 314A alone or OSC-1 314B alone to drive PLL-0 330 and PLL-1 350 and generate the data transmission/reception clock signals Clk-0 and Clk-1 in a synchronous fashion. For example, under normal operation of the clock generation circuitry, the MUXs 316A, 316B allow only the output from OSC-0 314A to pass through to PLL-0 330 and PLL-1 350, and the resultant data transmission/reception clock signals Clk-0, Clk-1 can operate synchronously, which provides minimized latency and high RAS performance when applied to the Tx Chip 320 and Rx Chip 240, respectively.

Following normal operation, if the oscillator that is supplying the common source of the clock to both Tx Chip 320 and Rx Chip 340 fails, some embodiments of the invention will automatically switch the alternate oscillator. For instance, if OSC-0 314A is providing a common clock and fails, recovery clock logic (not shown separately) switches both the MUXs 316A, 316B to use OSC-1 314B instead of OSC-0 314A, thus providing, once again, a common source, OSC-1 314B, for Clk0 and Clk1. Thus, the interface can once again operate in a synchronous fashion.

The switchover from one oscillator to another is not precise and, for a period of time, the Tx chip 320 can run off of one oscillator (either one) while the Rx chip 340 runs off the other oscillator. Also, there can be other cases where the Tx chip 320 and the Rx chip 340 are not using the same oscillator, as in the case of a pin failure. For example, the pin where OSC-0 314A couples to MUX 316A could break. In that case, the HSS system 300 requires the clock generation circuitry to switch PLL-0 from using OSC-0 314A (due to the bad pin) to using the other oscillator (OSC-1 314B) by switching the MUX 316A. At the same time, MUX 316B can continue to use OSC-0 314A as its source. Thus, the Tx chip 320 and the Rx chip 340 run with different clock sources for a long period of time. The synchronous data transmission/reception in the HSS system 300 can, therefore, be interrupted.

Because no two oscillators have the exact same frequency, there can be a very slow and small frequency drift between the two oscillators, which can't be controlled. In theory, and depending on the nature and extent of the failure scenario, the clock generation circuitry may eventually be able to sufficiently recover from the failure scenario to generate Clk-0 and Clk-1 in a manner that allows a return to synchronous data transmission/reception in the HSS system 300. However, until such time there will be a period during which the system is not able to operate synchronously. The previously-described automated synchronization mode functionality 342, in accordance with embodiments of the invention, also enables the HSS system 300 to continue operating when failure modes impact the clock generation circuitry of the HSS system 300. As noted previously, the automated synchronization mode functionality 342 detects the actual synchronization status of the data moving through the HSS system 300 and dynamically transitions the HSS system 300 between (or among) a multiplicity of synchronization modes, including, for example, synchronous, mesochronous, plesiochronous, and asynchronous to match the actual synchronization status (or needs) of the system 300. Additional details of how the automated synchronization modes functionality 342 can be implemented in accordance with embodiments of the invention are depicted in FIG. 4 and described below.

In some embodiments of the invention, the detection of different oscillators through the clock observation path (by comparing the control inputs of MUX 316A and MUX 316B, for instance) is used as a synchronization status check. Various methods to compare the clock sources in such a way, whether via hardware, firmware, code, or other means, are known to those skilled in the art and need no further explanation.

Figure 3B:
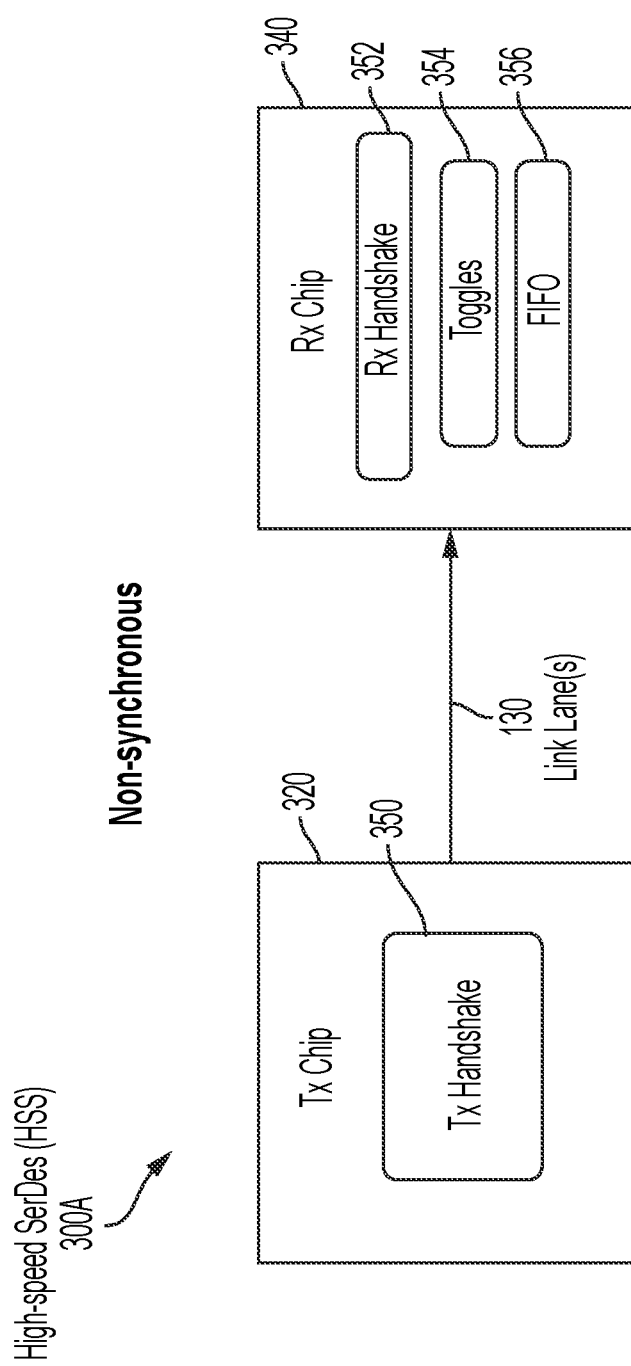
FIG. 3B depicts a block diagram illustrating a low-latency, high-availability HSS system in accordance with embodiments of the invention.

FIG. 3B depicts a block diagram illustrating an HSS system 300A in accordance with aspects of the invention. The HSS system 300A is a simplified illustration of the HSS system 300 shown in FIG. 3A, wherein the system 300A depicts a high level example of a non-synchronous operation mode (e.g., asynchronous, mesochronous, and plesiochronous) to which the HSS system 300 can be switched using the automated synchronization modes functionality 342 in accordance with aspects of the invention. As shown, the Tx chip 320 includes Tx handshake functionality 350, and the Rx Chip 340 includes Rx handshake functionality 352, toggles 354, and FIFO registers 356, configured and arranged as shown. The FIFO registers 356 include multiple individual registers, and the toggles 354 include multiple individual toggles. Each individual FIFO register and each individual toggle are matched 1:1 such that each FIFO register has a corresponding toggle. As data is written into each FIFO register, the data is not released from its FIFO register until the register's corresponding toggle goes through a metastability period. Each FIFO register also validates that the data it has received is valid based on a handshake between the Rx handshake 352 and the Tx handshake 350. Accordingly, the FIFO 356 does not forward data for deserialization until it has determined that its FIFO entries are received and valid, which includes making sure that the toggle entries are stable (i.e., they're stable functionally and no longer flipping between zero (0) and one (1)); and latching the data after metastability, with a local handshake confirmation between the Rx_clk (as shown as a recovered clock from CDR 250 in FIG. 2) and the local Rx clock domain (Clk-1 in FIG. 3A), confirming that the RX_data on the receive-side parallel bus 270 is valid. The HSS system 300A is one example of a non-synchronous operation mode into which the automated synchronization mode functionality 342 (shown in FIG. 3A) can switch the HSS system 300 (shown in FIG. 3A) when the functionality 342 detects that the HSS system 300 is no longer operating synchronously. Other suitable non-synchronous operating designs can be used with the automated synchronization mode functionality 342.

Figure 4:
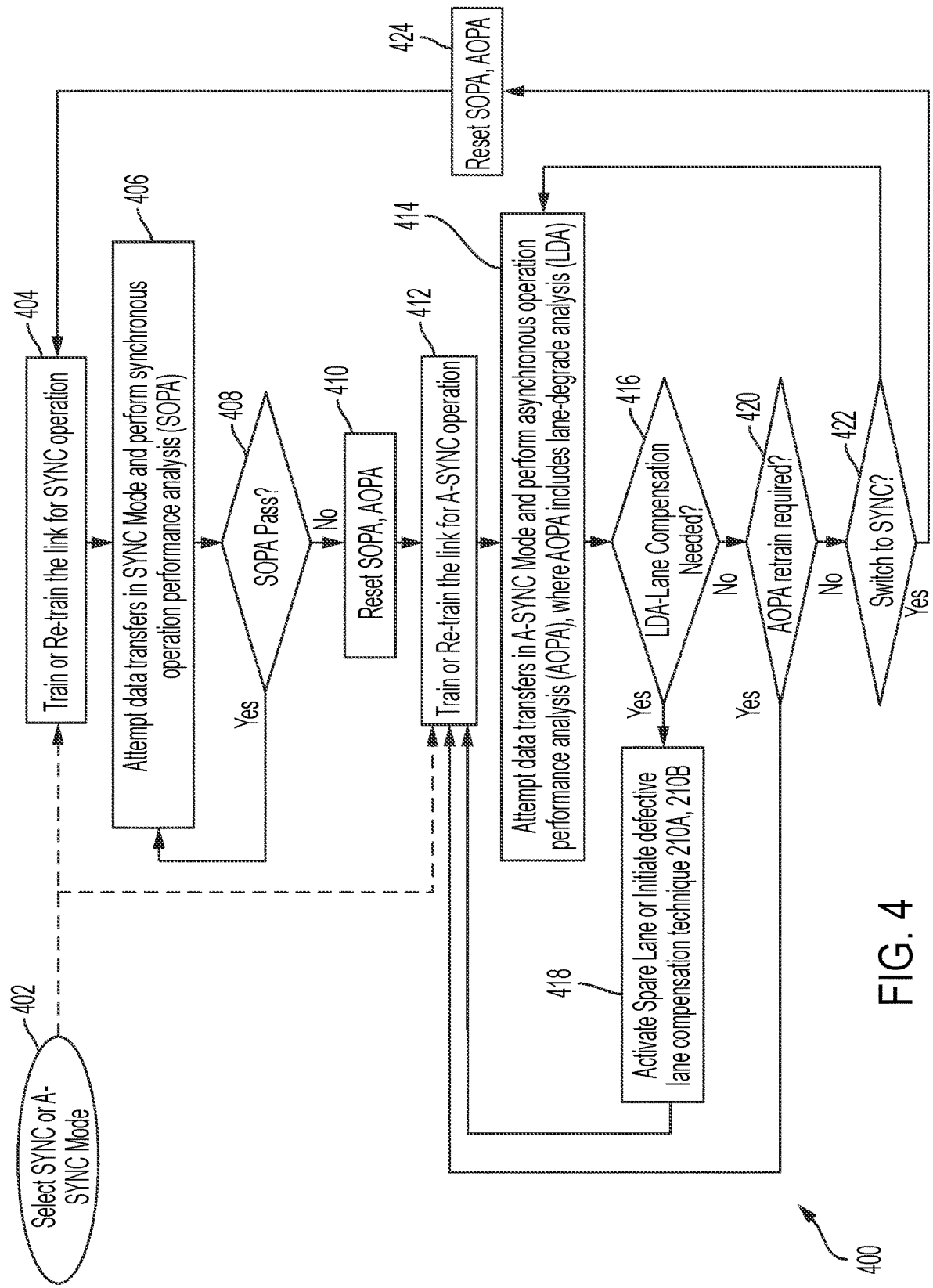
FIG. 4 depicts a flow diagram illustrating a computer-implemented methodology for implemented automated synchronization modes according to embodiments of the invention.

FIG. 4 depicts a flow diagram illustrating a computer-implemented methodology 400 according to embodiments of the invention. The computer-implemented methodology 400 can be performed by the automated synchronization modes functionality 342 of the HSS system 300 shown in FIG. 3A. In embodiments of the invention, the functionality 342 can be one or more modules so will be referred to subsequently herein as an automated synchronization modes (ASM) module 342. Some of the functionality of the methodology 400 is implemented by the ASM module 342 working with other circuitry and software, which can be implemented using a computing system such as computing system 1700 (shown in FIG. 17). Accordingly, the following descriptions of the methodology 400 will, where appropriate, refer to the blocks that make up the flow diagram depicted in FIG. 4, along with the relevant elements of the HSS system 300, 300A and/or the computing system 1700. Any reference to operations of the methodology 400 performed by the HSS system 300 includes operations where the HSS system 300 relies on and/or performs the operation using the computing system 1700. Additionally, while the methodology 400 focuses on a switch between operating synchronously or operating asynchronously, the methodology 400 can also be applied more generally to automatically switch between synchronous operation and non-synchronous operation where non-synchronous operation includes one or more of plesiochronous, mesochronous, and/or asynchronous operations.

Before describing the specific details of the methodology 400 shown in FIG. 4, an overview of the methodology 400 and its technical benefits will now be provided. In the overall operation of the methodology 400, operational checks are made during synchronous operation in order to make initial determinations about failure events, which can include misalignment between the transmitter clock and the receiver clock, as well as lane failures or degrades. The initial determinations are selected such that they provide a coarser assessment that a failure event has occurred, but they do not devote time or resources toward confirming at a relatively higher confidence level that the failure event is a transmitter/receiver clock misalignment or a lane failure while the HSS system 300 is in a synchronous operating mode. In some embodiments of the invention, one or more of these checks can occur while in synchronous mode. For instance, a bad lane can be determined and isolated using packet CRC detection combined with per-lane CRC detection. This lane can then be degraded while staying entirely in synchronous mode. However, there could be a disadvantage or a non-synchronous clock situation that makes a first lane appear to be bad and gets degraded. Meanwhile a second lane appears bad and also gets degraded. Eventually, all lanes will appear to be bad and will degrade, until the entire link may go down. It is possible this degrade might happen before the non-synchronous detection occurs.

In embodiments of the invention, switching to a "safe" asynchronous mode prior to performing any lane degrade can eliminate the preliminary degrade of lanes due to an asynchronous condition. In accordance with aspects of the invention, these initial determinations trigger the methodology 400 to switch the HSS system 300 into a "safe" asynchronous operating mode where serialization/transmission/deserialization operations can continue without the need for transmitter and receiver clock alignment. In accordance with aspects of the invention, while in the safe asynchronous operating mode, the methodology 400 performs additional checks to confirm at a higher level of confidence whether or not the initial checks that caused the switch into asynchronous operation reflect a clock misalignment issue or a lane degrade issue. If the additional checks confirm a clock misalignment issue, the methodology 400 takes steps to determine whether or not the HSS system 300 can be returned to synchronous operation without outside intervention or repair. If outside intervention/repair is needed to address the clock misalignment issue, the methodology 400 requests outside intervention/repair. If the additional checks confirm a lane degrade issue, the methodology 400 initiates one or more suitable lane degrade compensation techniques (e.g., table 600 shown in FIG. 6) and requests outside intervention/repair to address the lane degrade issue. Thus, in accordance with aspects of the invention, the methodology 400 does not attempt to address potential clock misalignment issues and potential lane degrade issues while the HSS system 300 is in a synchronous operating mode. It instead switches the HSS system 300 into a safe asynchronous operating mode; confirms the type of failure event; and carries out strategies targeted to address the type of failure mode. Addressing the failure event(s) in a safe asynchronous operating mode enables the HSS system 300 to continue operating while the failure modes are addressed and reduces the complexity of any failure mode mitigation/compensation strategies that are implemented. For example, the hardware circuitry and software required in order to implement the failure mode mitigation/compensation strategies shown in table 600 of FIG. 6 are much less complicated when the HSS system is in the safe asynchronous operating mode.

Turning now to the specific details of the methodology 400, as shown in FIG. 4, block 402 initiates the methodology 400 by selecting either the SYNC (synchronous) operation mode or the A-SYNC (asynchronous) operation mode for the HSS system 300. When the HSS system 300 is operating in the SYNC operation mode, the HSS system 300 sends serialized data from the Tx chip 320 through one or more of the serial link lanes 120 to the Rx chip 340 in a manner that relies on an alignment between a transmitter clock frequency of the Tx chip 320 and a receiver clock frequency of the Rx chip 340. When operating in the A-SYNC mode, the HSS system 300 sends serialized data from the Tx chip 320 through one or more of the serial link lanes 120 to the Rx chip 340 in a manner that does not require alignment between the transmitter clock frequency of the Tx chip 320 and the receiver clock frequency of the Rx chip 340. Note that in some embodiments of the invention, the Tx chip 320 always operates synchronously with the Tx side and does not have to operate differently for SYNC mode vs. A-SYNC mode. In some embodiments of the invention, the Rx chip 340 alone controls the SYNC mode vs. A-SYNC mode behavior. If SYNC mode is selected at block 402, the methodology 400 moves from block 402 to block 404. If A-SYNC mode is selected at block 402, the methodology 400 moves from block 402 to block 412. For ease of explanation, it will be assumed that the initial selection at block 402 is SYNC mode.

At block 404, the methodology 400 performs timing-related operations of the HSS system 300, which include, for example, performing training steps on the serial link lane(s) 120 to prepare the HSS system 300 for generating serialized data traffic in the SYNC operating mode. Additionally, the training steps performed at block 404 include running a so-called "bump UI" process in which the receive Rx_clk generated by CDR 250 for each lane of the Rx chip 340 is aligned to the local receive clock Clk-1 also on Rx chip 340, and appropriate adjustments are made across the various serial link lanes 120. It should be noted that the bump UI process will make the initial mesochronous interface (in which the arrival phase of each lane can initially arrive at any phase relative to the local clock) behave almost identical to a synchronous interface, with a slight misalignment to the nearest UI increment. In some embodiments of the invention, the bump UI process is required during the initial training of the link for SYNC operation 404.

From block 404, the methodology 400 moves to block 406 and begins sending serialized data/overhead 102 from the Tx chip 320 over the serial link lanes 120 to the Rx chip 340 in SYNC operating mode. While the HSS system 300 is generating and transmitting serialized data traffic, block 406 also performs a variety of types of synchronous operation performance analysis (SOPA) on the HSS system 300. In some embodiments of the invention, the SOPA can include synchronous operation performance metrics (SOPM). In embodiments of the invention, the SOPA can include a variety of types of analyses that provide an indication to the methodology 400 of whether or not the HSS system 300 is still transmitting and receiving serialized data synchronously. At decision block 408, the methodology 400 evaluates results of the SOPA to determine whether or not the SOPA is "passed" or "failed." In embodiments of the invention, the pass/fail standard used at decision block 408 can be a rate (e.g., events per unit of time), a pattern (number of consecutive events), just a single event (e.g., link training failure and/or CRC failure), and the like. If the result of the inquiry at decision block 408 is a pass, the methodology 400 determines that the SOPA indicates that the HSS system 300 is still operating synchronously, and the methodology 400 returns to block 406 where the HSS system 300 continues in SYNC operating mode. If the result of the inquiry at decision block 408 is a fail (or not pass), the methodology 400 determines that the SOPA indicates that the HSS system 300 is no longer operating synchronously, and the methodology 400 moves to block 410 to begin transitioning the HSS system 300 from the SYNC operating mode to the A-SYNC operating mode.

In accordance with embodiments of the invention, the SOPA and the pass/fail standard used at decision block 408 can take a variety of forms. For example, in some embodiments of the invention, the SOPA can focus on analyzing data traffic on the various lanes of the HSS system 300. As an example of a data-traffic type of SOPA, in some embodiments of the invention, the SOPA can include an analysis of sequence numbers and/or cyclic redundancy check (CRC) data included within each data packet. The sequence number is an incrementor that is sent from the Tx chip 320 as a way to allow the Rx chip 340 to validate that it is not accepting the wrong packet. CRC is a check value used to detect transmission errors in a block or packet of data. The Tx chip 320 encodes the calculated CRC value and appends it to the data transmitted over the serial link lanes 120. The Rx chip 340 decodes the calculated CRC value and compares it to the received data. Errors in the CRC check indicate data was corrupted during transmission. When the Rx chip 340 receives a packet of data, the chip 340 checks the sequence number to confirm that it matches the sequence number of the next packet to be transferred. The Rx chip 340 also checks the CRC. The results of the sequence number check and/or the CRC check are recorded so that the decision block 408 can evaluate how they behave over time. In some embodiments of the invention, the pass/fail standards for the sequence number checks and the CRC checks are set such that individual instances of bad sequence number checks and/or CRC checks are insufficient to generate a "fail" at decision block 408. In some embodiments of the invention, in addition to returning the methodology 400 from block 408 to block 406 (i.e., keeping the HSS system 300 in the SYNC operating mode), individual instances of bad sequence number checks and/or bad CRC checks can also prompt the Rx chip 340 to send a no-acknowledgement (NAK) signal to the Tx chip 320 with a request that the Tx chip 320 replay or resend the packet that did not pass the sequence number check and/or the CRC check.

As noted above, the stored sequence data checks and CRC checks are also evaluated at decision block 408 using a pass/fail standard tailored for the stored sequence number checks and CRC checks. More specifically, the pass/fail standard applied at decision block 408 for the behavior of the sequence numbers and CRC values over time can be set such that a failure determination means that the behavior of the sequence numbers and the CRC values over time indicates that the Tx chip 320 may no longer be transmitting packets to the Rx chip 340 synchronously. In some embodiments of the invention, the pass/fail standards for the stored results of sequence number checks and/or CRC checks over time while the HSS system 300 is in SYNC operating mode can be set as threshold values tailored for the sequence number and the CRC.

As another example of a data-traffic type of SOPA, in some embodiments of the invention, the SOPA can include an analysis referred to herein as error detection per lane (EDPL). For EDPL, within each lane, the Tx chip 320 periodically sends a special EDPL control or command to the Rx chip 340, and the EDPL control/command has a byte of CRC (separate from CRCs within packets) that pertains just to that lane. The Rx chip 340 checks to determine whether the local CRC generated from the serialized data stream 102 over the period of time since the prior EDPL control/command matches the CRC in the current EDPL control/command. If the EDPL controls/commands match, the Rx chip 340 assumes that the lane was good for that duration (i.e., from the last EDPL to the current EDPL). If the EDPL controls/commands mismatch, the Rx chip 340 determines that the associated lane experienced some type of failure (e.g., a bad bit). The Rx chip 340 stores (e.g., by incrementing a counter) each EDPL mismatch event on a per lane basis. The stored EDPL mismatch events are evaluated at decision block 408 using a pass/fail standard tailored for the stored EDPL mismatch events. More specifically, the pass/fail standard applied at decision block 408 for the behavior of EDPL mismatch events over time can be set such that a fail determination means that the behavior of the EDPL mismatch events over time indicates that the Tx chip 320 may no longer be transmitting packets to the Rx chip 340 synchronously. In some embodiments of the invention, the pass/fail standards for the stored EDPL mismatch events that occurred over time while the HSS system 300 is in SYNC operating mode can be set as threshold values tailored for the EDPL mismatch events on a per lane basis or across multiple lanes.

Additional examples of SOPA include an analysis of whether or not a training failure occurred either during an attempted training at block 404 or subsequent to a successful training. A training failure could be caused by a lane degrade or failure. A so-called "block lock" is set when link training is successfully completed and the link/lane is available (or locked) for the transmission of data. A failure to achieve a "block lock" status during training or a switch of the "block lock" status to "block unlock" subsequent to training indicates a potential problem with that lane. SOPA that represents training failure events, which can result from unsuccessful training or can occur after successful training, are evaluated at decision block 408 using a pass/fail standard tailored for the training failure event. In some embodiments of the invention, the pass/fail standards for the training failure event that occurred while the HSS system 300 is in SYNC operating mode can be set as threshold values tailored for the training failure event on either a per lane basis or across multiple lanes.

Additional examples of SOPA include data timing analysis that provides an indication that the transmitter clock frequency and the receiver clock frequency are out-of-sync. For example, in accordance with aspects of the invention, a drift detection technique 1520 (shown in FIG. 15) can be used as SOPA in the methodology 400. As described subsequently herein, embodiments of the invention provide novel methods to analyze the behavior of a jitter window to determine that a transmitter clock frequency and a receiver clock frequency are drifting apart based on the movement of a jitter window. In general, jitter can be defined as a variation in the delay of received data packets. At the Tx chip 320, packets are sent in a continuous stream with the packets spaced evenly apart. Due to network congestion, improper queuing, or configuration errors, this steady stream can become lumpy, or the delay between each packet can vary instead of remaining constant. This variation or jitter occurs within a time window (e.g., the predicted tail shown in FIG. 15) and the specific values of jitter delay at any given moment tends to oscillate back and forth within the predicted tail window. The predicted tail can itself move, and, in accordance with aspects of the invention, a programmable jitter relief technique 1410 (shown in FIG. 14) can be used to make sure that the predicted tail occurs after a complete data segment (e.g., data segment 112A shown in FIG. 1) has been received, which insures that the Rx chip 340 can capture a complete data segment.

The drift detection technique 1520 (shown in FIG. 15) evaluates the movement of the predicted tail window (with or without the programmable jitter relief technique 1410) to determine whether or not the movement of the window is sufficiently large to indicate that the "drift" may be occurring, and to further indicate that the most likely cause of drift is a misalignment between the frequency of the transmitter clock and the receiver clock. The drift detection event is evaluated at decision block 408 using a pass/fail standard tailored for the nature of the particular drift detection technique being used (e.g., drift detection 1520). More specifically, the pass/fail standard applied at decision block 408 for the drift detection event can be set such that a fail determination means that the drift detection event indicates that the Tx chip 320 may no longer be transmitting packets to the Rx chip 340 synchronously. In some embodiments of the invention, the pass/fail standards for the drift detection event that occurred while the HSS system 300 is in SYNC operating mode can be set as one or more threshold values tailored for the drift detection technique being used. Although the drift detection technique 1520 is in accordance with aspects of the invention, known out-of-sync detection techniques can be used as SOPA in the methodology 400.

In accordance with embodiments of the invention, the HSS system 300 can be configured to respond to a "SWITCH" software command received from an external control system (e.g., computing system 1700 shown in FIG. 17) that forces the HSS system 300 to switch its operating mode (e.g., from SYNC to A-SYNC and vice versa). Accordingly, a SWITCH command can be received at any point in the methodology 400. In some embodiments of the invention, the SOPA can be a SWITCH command, and the pass/fail standard applied at decision block 408 can simply be whether or not the SWITCH command has been received. For example, in some embodiments of the invention, the previously-described external control systems can be used to determine that a mismatch between Clk-0 generated by OSC-1 314B and Clk-1 generated by OSC-0 314A, for instance, has occurred then issue a SWITCH command to the HSS system 300 to enter A-SYNC mode.

In accordance with embodiments of the invention the various types of SOPA disclosed herein can be evaluated alone or in any combination at decision block 408 based on a variety of considerations. For example, in accordance with some embodiments of the invention, an assessment of the general reliability of the various types of SOPA to accurately predict the source of failure events can be determined, and the selection of SOPA to evaluate at decision block 408 can be a combination of one or more less reliable SOPA into a more reliable combined SOPA. For example, some drift detection techniques incorporate asynchronous-based and/or analog-based analysis techniques, so this type of SOPA can be combined with other types of SOPA (e.g., data-traffic type SOPA) that rely more on digital circuitry that is generally more reliable.

As previously noted, if the answer to the pass/fail inquiry at decision block 408 is fail (or no), the methodology 400 moves to block 410 and resets the various storage locations that hold the SOPA results gathered at block 406 so that the prior SOPA results do not corrupt any subsequent SOPA results. The methodology 400 then moves to block 412 and trains or retrains the serial link lanes 120 for sending serialized data in an A-SYNC operating mode. From block 412, the methodology 400 moves to block 414 and begins sending serialized overhead/data 102 from the Tx chip 320 to the Rx chip 340 in the A-SYNC operating mode (e.g., HSS system 300A shown in FIG. 3B). Block 414 also performs asynchronous operation performance analysis (AOPA), where AOPA includes lane-degrade analysis (LDA) that determines whether one or more of the serial link lanes 120 have developed one or more defects and are no longer operative. Block 414 also continuously performs the previously described checks for individual instances of bad sequence numbers and/or bad CRCs that prompt the Rx chip 340 to send a NAK signal from the Rx chip 340 with a request that the Tx chip 320 replay or resend the packet that did not pass the sequence number check and/or the CRC check.

Figure 10:
FIG. 10 depicts a diagram illustrating a more detailed example of how a low-latency HSS receiver reroutes serialized data in accordance with embodiments of the invention when one or more lanes are degraded.

In embodiments of the invention, the AOPA (and its subset LDA) can include a variety of types of analyses that provide an indication to the methodology 400 of whether or not the HSS system 300 has experienced a lane degrade failure; has experienced a transmitter/receiver clock misalignment; and/or can safely return to transmitting and receiving serialized data synchronously. At decision block 416, the methodology 400 evaluates results of the LDA to determine whether or not defective lane compensation is required. In embodiments of the invention, the determination performed at decision block 416 can be based on a rate (e.g., events per unit of time), a pattern (number of consecutive events), just a single event (e.g., link training failure), and the like. If the result of the inquiry at decision block 416 is yes, the methodology 400 determines that the HSS system 300 has suffered a lane degrade failure event and moves to block 418 to either activate a spare lane (if a spare lane has been provided) or initiate the defective lane compensation circuits 210A, 210B (shown in FIG. 2). Additional details about suitable defective lane techniques that can be applied at block 418 are shown in FIGS. 8-10 and described subsequently herein. In some embodiments of the invention, block 418 can also initiate a request for outside intervention/repair to address the lane degrade issue. From block 418, the methodology 400 moves to block 412 to retrain the link for A-SYNC operation.

If the result of the inquiry at decision block 416 is that defective lane compensation is not required, the methodology 400 moves to decision block 420 to evaluate additional AOPA. More specifically, if the methodology 400 determined previously that a failed lane-degrade related SOPA was used at decision block 408 to initiate the A-SYNC operating mode, but subsequently determined at decision block 416 that the LDA performed in the A-SYNC operating mode did not require lane degrade compensation, the methodology 400 concludes that the previously failed lane-degrade related SOPA at decision block 408 might have resulted from a transmitter/receiver clock frequency misalignment rather than a lane degrade. Accordingly, the AOPA evaluations at decision blocks 420 and 422 can focus on the analysis of data timing. For example, in accordance with aspects of the invention, a drift detection technique 1520 (shown in FIG. 15) can be used as AOPA in decision block 420. In some embodiments of the invention, the drift detection is excluded from the AOPA because lower-level drift is no longer a concern while in A-SYNC mode. Additionally, in some embodiments of the invention, the AOPA in decision block 422 can be the SWITCH command, and the determination made at decision block 422 can simply be whether the SWITCH command has been received (e.g., a SWITCH command was used at decision block 408 to initiate the A-SYNC operating mode). For example, in some embodiments of the invention, the previously-described external control systems can be used to determine that a mismatch between Clk-0 generated by OSC-0 314A and Clk-1 generated by OSC-1 314B has occurred then issue a SWITCH command to the HSS system 300.

If the inquiry at decision block 420 indicates that a retrain is required, the methodology 400 determines that the HSS system 300 must continue operating in the safe A-SYNC operating mode and returns to block 412 to train or retrain the serial link lanes 120 for A-SYNC operating mode. The evaluations previously described for SOPA such as CRC checks, sequence number checks, EDPL checks and loss of block lock can be used at decision block 420 to determine whether a retrain is required. In some embodiments of the invention, different threshold values can be used for SOPA and AOPA analysis.

If result of the inquiry at decision block 420 is that no retrain is required, the methodology 400 determines, based at least in part on having passed (i.e., a "no" result) both the LDA evaluation at decision block 416 and the AOPA evaluation at decision block 420, that it is likely safe to return the HSS system 300 to SYNC operating mode. Accordingly, the methodology 400 moves to decision block 422 to make a final evaluation of whether or not it is safe to return to SYNC operating mode. The evaluation at decision block 422 can include any combination of the previously-described SOPA, AOPA, and LDA evaluations used in the methodology 400. In some embodiments, the decision block 422 to evaluate whether to switch to SYNC mode can also be based on checking the status of the oscillator MUXs 316A, 316B (shown in FIG. 3B) to first ensure that a common OSC source exists. If the result of the inquiry at decision block 422 is to remain in A-SYNC operating mode, the methodology 400 determines that it is not in fact safe to return to SYNC operating mode and returns the methodology 400 to block 414 for continued operation in A-SYNC operating mode. In some embodiments of the invention, if the inquiry at decision block 422 indicates remaining in A-SYNC operation, the methodology 400 can also initiate a request for outside intervention/repair to address the bad oscillator issue.

If the result of the inquiry at decision block 422 is to switch to SYNC operating mode, the methodology 400 determines that it is safe to return to SYNC operating mode and moves to block 424 to reset SOPA and AOPA storage locations. The methodology 400 then returns to block 404 to train or retrain the link for the SYNC operating mode. In some embodiments of the invention, switching from A-SYNC operating mode to SYNC operating mode will behave like an initial training step (as opposed to a retraining) and will run the Bump_UI procedure again to obtain strong synchronous alignment.

As previously described herein the HSS system 200 (shown in FIG. 2) includes fine-granularity deserialization functionality 248. In accordance with aspects of the invention, the fine-granularity deserialization functionality 248 utilizes a data deserialization ratio at the deserializer 246 (shown in FIG. 2) that is more granular (e.g., an 8:1 deserialization ratio) than the serialization ratio (e.g., a 16:1 serialization ratio) used at the serializer 226 (shown in FIG. 2). Accordingly, the fine-granularity deserialization function 248 enables the deserializer 246 to load and use deserialized data sooner, which improves latency performance of the HSS system 200. Example implementations of the fine-granularity deserialization functionality 248 are described below and illustrated by the diagrams in FIGS. 5A, 5B, 5C, and 5D.

Figure 5A:
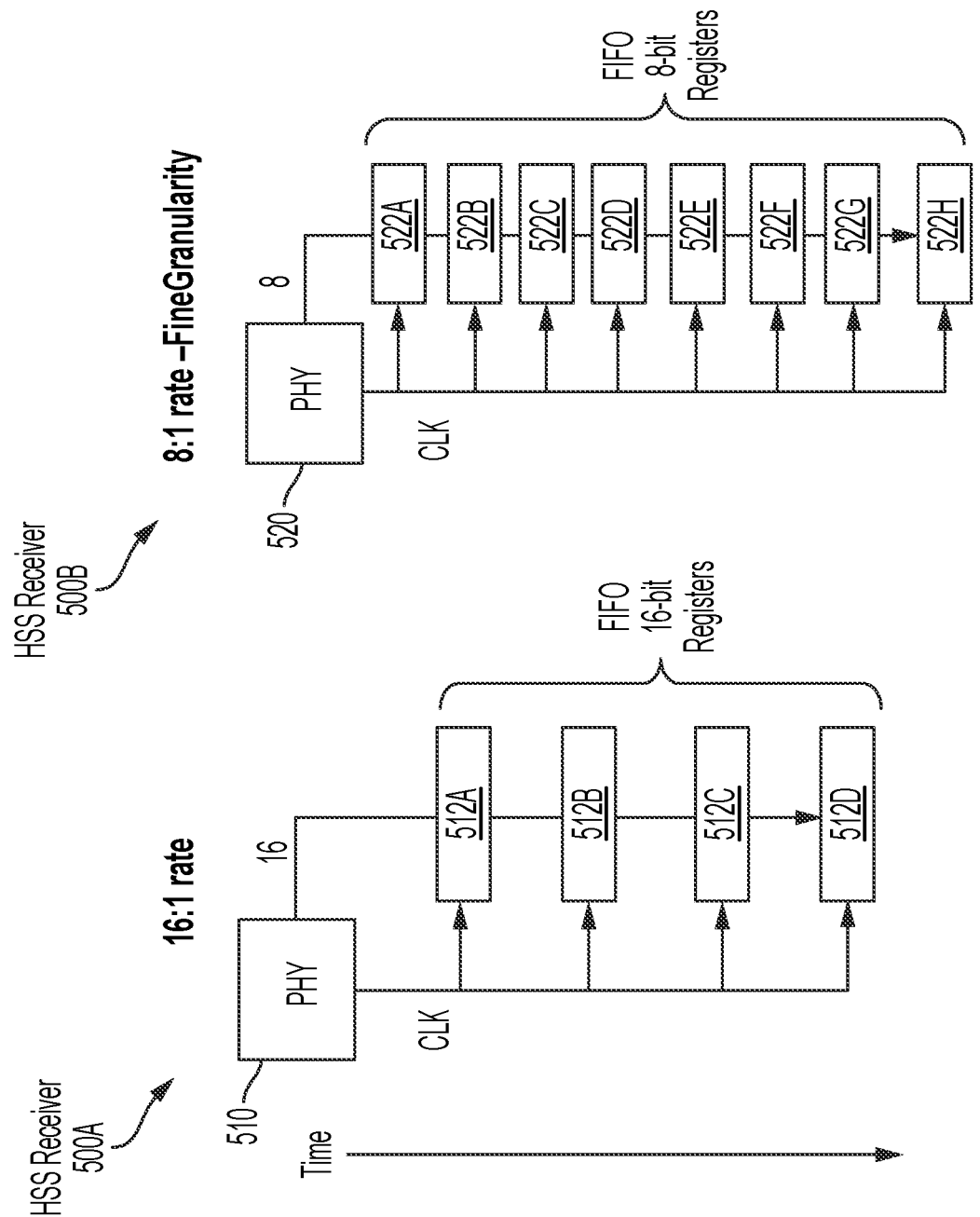
FIG. 5A depicts a block diagram illustrating a fine-granularity deserialization function in accordance with embodiments of the invention.

FIG. 5A depicts simplified block diagrams illustrating low-latency HSS receivers 500A, 500B, which correspond to the Rx chip 240 (shown in FIG. 2) and illustrate fine-granularity functionality 248 (shown in FIG. 2) in accordance with embodiments of the invention. The HSS receiver 500A includes a physical (PHY) layer 510 configured to couple clock signals (CLK) and serialized 16-bit data segments (e.g., serialized 16-bit data segment 112A1 shown in FIG. 1) for sequential loading in a set of four (4) 16-bit FIFO registers 512A-512D. As each FIFO register 512A-512D is loaded and validated (e.g., using known techniques), the contents of each of the FIFO registers 512A-512D are provided to downstream logic for additional processing, including deserialization to generate Rx_data (shown in FIGS. 2 and 3A). The HSS receiver 500A is identified as having a 16:1 deserialization ratio because each of the FIFO registers 512A-512D is 16 bits wide for loading 16 bits at a time from each lane.

The HSS receiver 500B includes a PHY layer 520 is configured to couple CLK and serialized 8-bit data segments for sequential loading in a set of eight (8) 8-bit FIFO registers 522A-522H. As each of the FIFO registers 522A-522H is loaded and validated (e.g., using novel fine-granularity techniques), the contents of each of the FIFO registers 522A-522H are provided to downstream logic for additional processing, including deserialization to generate Rx_data (shown in FIGS. 2 and 3A). The HSS receiver 500B is identified as have an 8:1 deserialization ratio because each of the FIFO registers 522A-522H is 8 bits wide for loading 8 bits at a time from each lane.

Figure 5B:
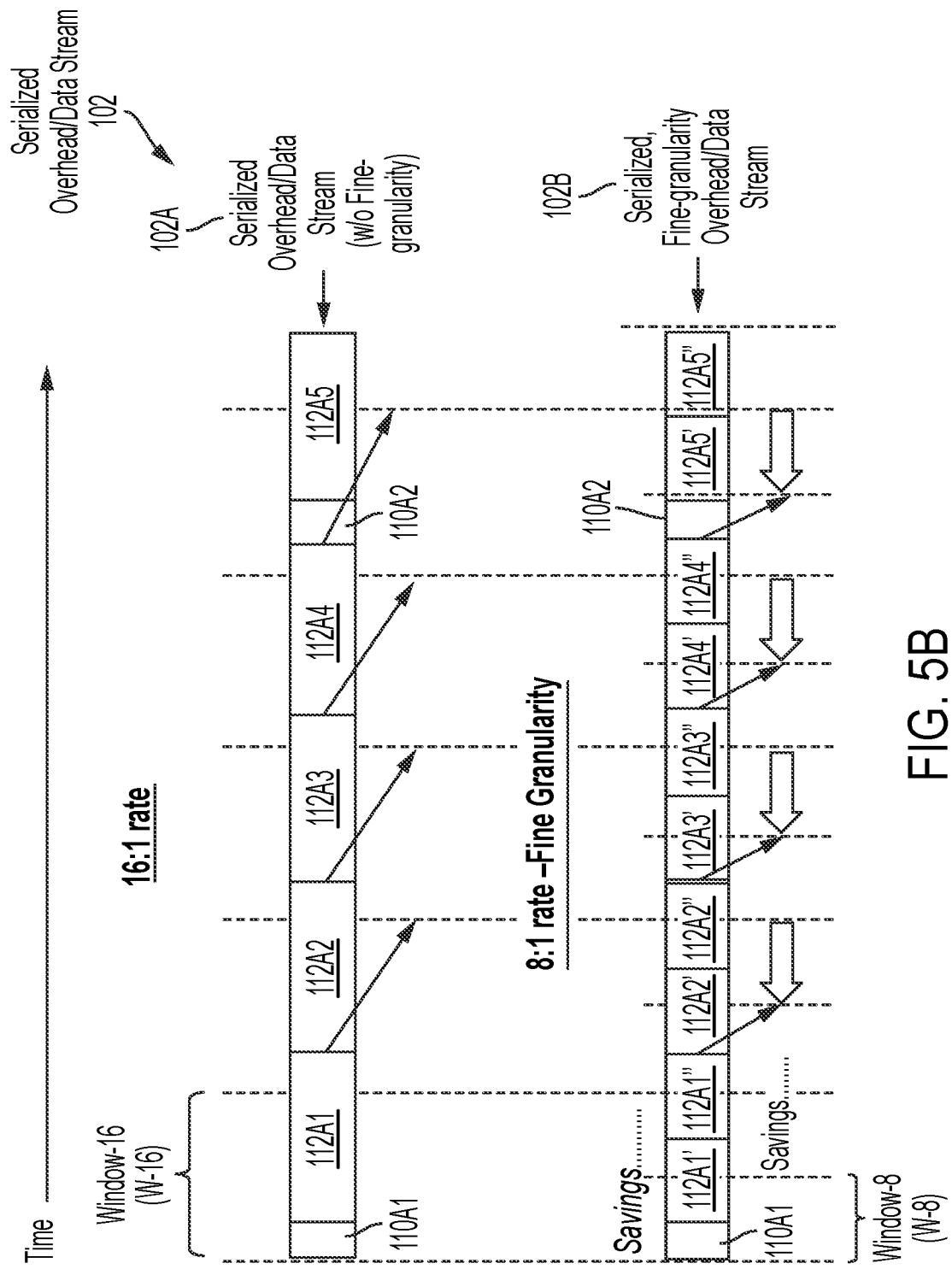
FIG. 5B depicts a timing diagram illustrating a fine-granularity deserialization function in accordance with embodiments of the invention.

FIG. 5B depicts a combination block diagram and timing diagram that illustrates a serialized overhead/data stream 102, consisting of a serialized overhead/data stream (without fine-granularity) 102A and a serialized fine-granularity overhead/data stream 102B. The data streams 102A, 102B are depicted in a manner that aligns the streams 102A, 102B with one another to depict a comparison between how the serialized overhead/data stream (without fine-granularity) 102A would be loaded by the HSS receiver 500A (shown in FIG. 5A) and how the serialized fine-granularity overhead/data stream 102B would be loaded by the HSS receiver 500B (shown in FIG. 5A). The structure of data stream (without fine-granularity) 102A corresponds to the data streams 102 shown in FIGS. 1, 2, and 3A. The structure of fine-granularity data steam 102B also corresponds to the data streams 102 shown in FIGS. 1, 2 and 3A except each segment (e.g., 112A1) has been virtually divided into sub-segments (e.g., 112A1', 112A1") to better identify the 8:1 fine-granularity function 248 (shown in FIG. 2). In fact, the segment size of the stream 102B is sent from the driver with 16-bit segments that are loaded at an 8:1 ratio at the HSS receivers 500B.

Referring now to FIGS. 5A and 5B, a description of the fine-granularity functionality of the HSS receiver 500B will now be provided with reference to the receivers 500A, 500B shown in FIG. 5A and the block/timing diagram shown in FIG. 5B. As shown in FIG. 5B, W-16 defines the capture window for the stream 102A, and W-8 defines the capture window for stream 102B. As shown, because of the sync header (SH) bits 110A1, 16-bit segment 112A1 cannot be loaded into FIFO register 512A and 512B until two W-16 windows have passed. In comparison, because of the sync header SH bits 110A1, 8-bit segment 112A1' cannot be loaded into FIFO register 522A and 522B until two W-8 windows have passed. However, because W-8 is one-half the size of W-16, the FIFO register 522A is loaded in half the time it takes to load the FIFO register 512A. Additionally, a complete 16-bit frame is loaded from stream 102A after two W-16 time-frames have passed, while a complete 16-bit frame is loaded from steam 102B after 3 W-8 time-frames have passed. Accordingly, because of the fine-granularity FIFO structure and register loading logic of the HSS receiver 500B, 16-bit data segments (e.g., 112A1' and 112A1") are available to be removed from FIFO registers 522A-522H for downstream processing (e.g., deserialization) sooner than the 16-bit data segments (e.g., 112A1) are available to be removed from FIFO registers 512A-512D for downstream processing (e.g., deserialization), despite the fact that both HSS receivers 500A, 500B require 16 bits of data to form a valid data segment. Also, because of the periodic addition of the sync header, the latency of the trailing edge of any packet of data will continue to be delayed. Accordingly, even if a 16:1 rate packet is optimized for the first sync header into a clock edge similar to where the first packet (i.e. 112A1' and 112A1") is captured, future sync headers will eventually lead to a delayed trailing edge. This trailing edge on HSS Receiver 500A with 16:1 rate will always be larger than the corresponding edge on the more granular HSS Receiver 500B. The 16:1 transmission ratio and the 8:1 fine-granularity deserialization ratio are non-limiting examples of transmission ratios and fine-granularity deserialization ratios that can be used in embodiments of the invention. In general, any fine-granularity deserialization ratio that is less than the transmission ratio would provide benefits. In embodiments of the invention, it has been discovered that a fine-granularity deserialization ratio that is one half of the transmission ratio (as depicted in FIGS. 5A and 5B) provides technical effects and benefits.

FIG. 5C depicts an HSS receiver 500B', wherein, in accordance with embodiments of the invention, the fine-granularity FIFO structure and register loading logic of the HSS receiver 500B (shown in FIG. 5A) are augmented by also providing a sub-packet reorganization function as depicted by the HSS receiver 500B' shown in FIG. 5C and the related timing diagram shown in FIG. 5D. In accordance with aspects of the invention, the register loading logic of the HSS receiver 500B' and an associated transmitter (e.g., Tx chip 220 shown in FIG. 2) can be configured to place the data stream 102B on a link lane (e.g., serial link lane 120 shown in FIGS. 1-3A) connecting the transmitter and the HSS receiver 500B' in "sub-packets" or "action groups," wherein the 8-bit segments that form the action group are in sequential order in the data stream 102B. HSS receiver 500B' depicts an example in which consecutive 8-bit segments can be loaded into consecutive FIFO registers 522A'-522H' from the output of the PHY 520'. In some embodiments of the invention, after FIFO register 522H' is loaded, the FIFO register 522A' is loaded next, in a looping fashion. The registers in the FIFO 522A'-522H' illustrate the concept of fine granularity with "sub-packets" or "action groups" and are not necessarily limited to a quantity of eight nor tied directly to the W-8 timing windows shown in the timing diagrams in FIG. 5D.

HSS receiver 500B' depicts an example in which 8-bit segments 112A1' and 112A1"-112A5' and 112A5" that form the action group are placed in sequential order in the fine-granularity FIFO 8-bit registers 522A'-522H' using sub-packet reorganization in accordance with aspects of the invention. As shown, the HSS receiver 500B' includes substantially the same register and physical layer structure as the HSS receiver 500B shown in FIG. 5A. In some embodiments of the invention, the sub-packet data can be separated or interspersed with required sync headers 110A1. In some embodiments of the invention, sub-packets of the same packet are not separated by sync headers, as illustrated by example.

FIG. 5D depicts a timing diagrams illustrating the fine-granularity deserialization function with sub-packet reorganization of the HSS receiver 500B' (shown in FIG. 5C) in accordance with embodiments of the invention. As shown, the latency of a 16-bit packet using an 8:1 fine-granularity FIFO can arrive at time T1, which is shown for each of the packets. This is the next FIFO clock that is after the last portion of data residing in an 8-bit FIFO Register. While this T1 time for an 8:1 FIFO with fine granularity is earlier than the time for a 16:1 FIFO without fine granularity, as described earlier, there is still an opportunity to use some of the packet data even earlier than T1. Examples of early data use include, but are not limited to, valid bits to power-up circuits, pre-selectors, control priority requests, cache addresses, cache enables, array enables, memory activations, precharge circuits, and the like. While the entire line may be needed for completing a next transaction, including checking the packet, the early data can be used to optimize overall system performance for the cases where there are no errors.

The bottommost timing in FIG. 5D depicts a fine-granularity FIFO with "sub-packet" organization. In some embodiments of the invention, the partial packet 112A1', arriving after the second FIFO register (e.g., 522B'), is available. This is shown as T2 on the diagram for each of the packets. The remaining portion of the packet 112A1" is not available until after the third FIFO cycle (e.g., 522C'). This is shown as T1 for each of the packets. In the examples, for each packet, T2 is earlier than T1. By organizing the packet such that the critical bits are in the first half of the packet and providing for the double clock speed (i.e., T1 and T2), there are advantages that can be realized from these early data bits, as described earlier. In some embodiments of the invention, the trailing edge of the packet, completing at time T1, is used for packet checking and issues a cancel control to stop the work that was speculatively started at time T2 of that packet.

As previously noted herein, the HSS system 200 (shown in FIG. 2) includes, in addition to the fine-granularity deserialization functionality 248, defective lane compensation circuitry 210A, 210B. In accordance with aspects of the invention, the defective lane compensation circuits 210A, 210B implement various novel techniques for rerouting transmitted/received data when an instance of the data transmission lanes (e.g., serial link lane 120) of the HSS system 200 malfunctions and no longer transmits data. Rather than provide wasteful spare lanes and/or spare cycles that remain idle until a transmission lane malfunctions, the defective lane compensation circuitry 210A, 210B in accordance with embodiments of the invention utilize data re-routing logic that enables the functioning lanes to transmit data to utilize the full remaining bandwidth later. The data is re-routed from the defective lane, thereby enabling the functioning transmission lanes to process data at a linearly scaled bandwidth matching the loss of the one or more lanes. As previously noted, additional details of the fine-granularity functionality 248 and the defective lane compensation circuitry 210A, 210B are described and illustrated subsequently herein. In accordance with embodiments of the invention, the defective lane compensation circuitry 210A, 210B, as well as other defective lane compensation techniques (e.g., table 600 shown in FIG. 6) can also be used at block 418 of the methodology 400 shown in FIG. 4. In accordance with embodiments of the invention, the methodology 400 implements features of the novel automated synchronization mode functionality 342 shown in FIG. 3A.

Figure 12A:
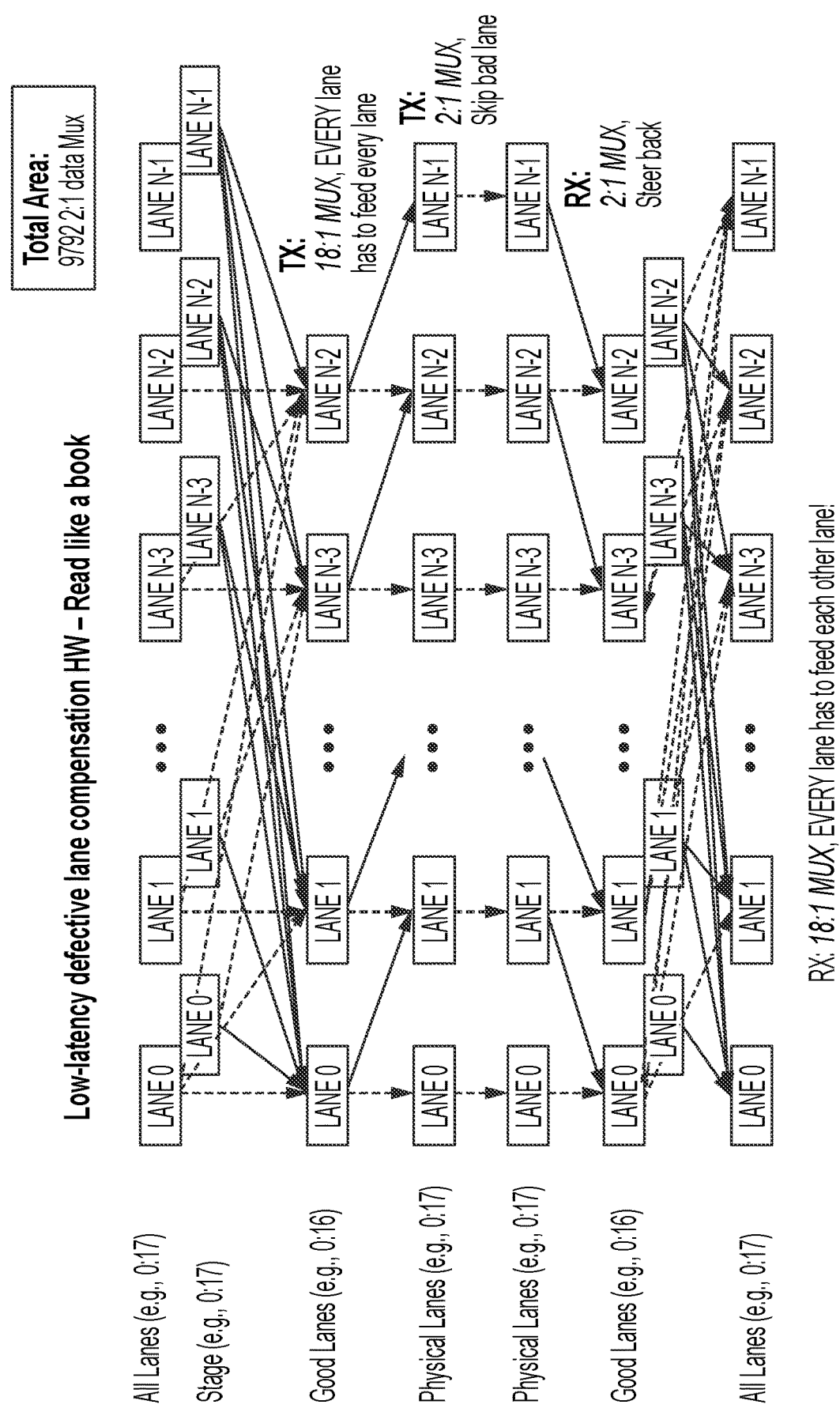
FIG. 12A depicts a diagram illustrating an example of how hardware of a low-latency HSS receiver that reroutes serialized data as depicted in FIG. 8 can be implemented in accordance with embodiments of the invention.
Figure 12B:
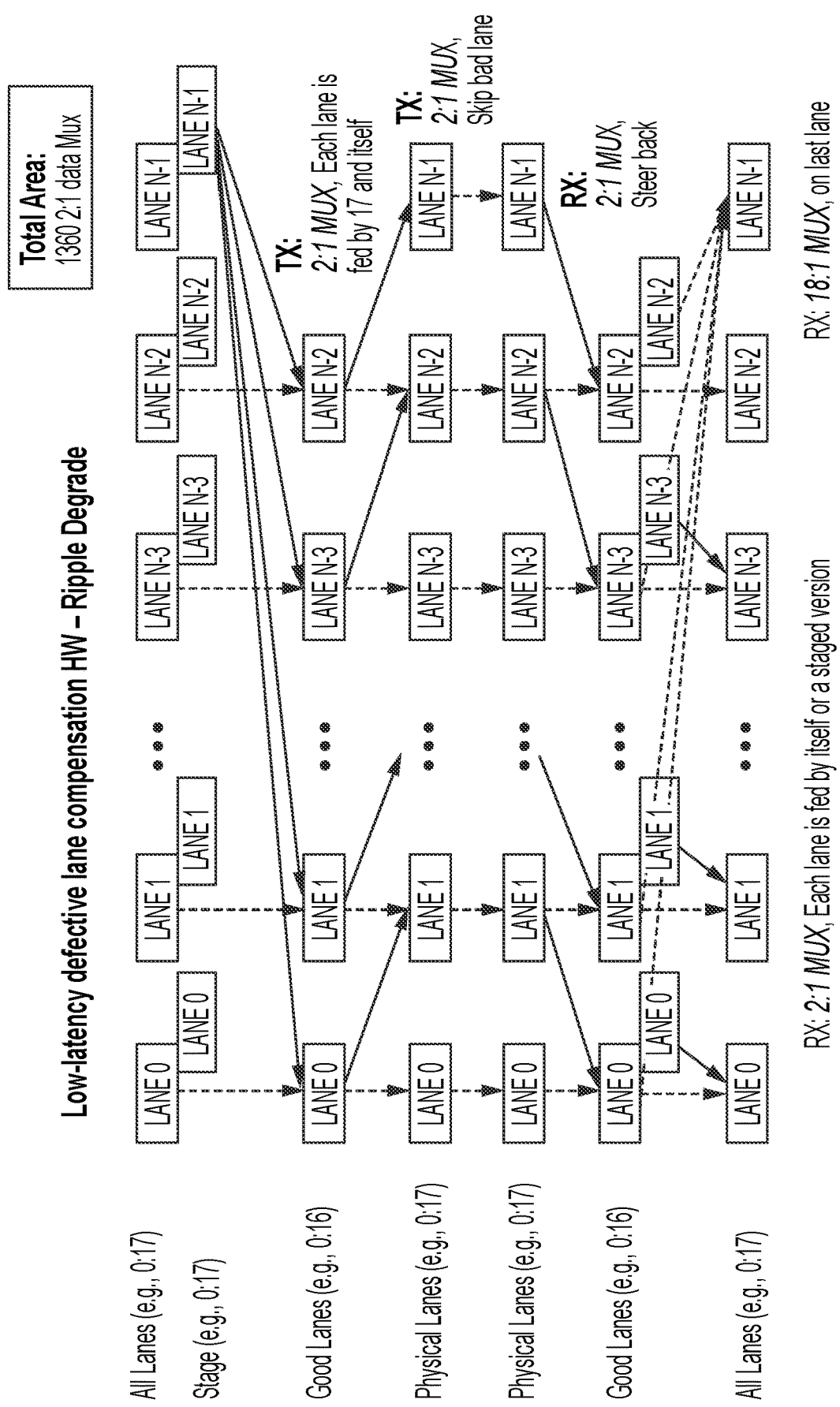
FIG. 12B depicts a diagram illustrating an example of how hardware of a low-latency HSS receiver that reroutes serialized data as depicted in FIG. 9 can be implemented in accordance with embodiments of the invention.
Figure 12C:
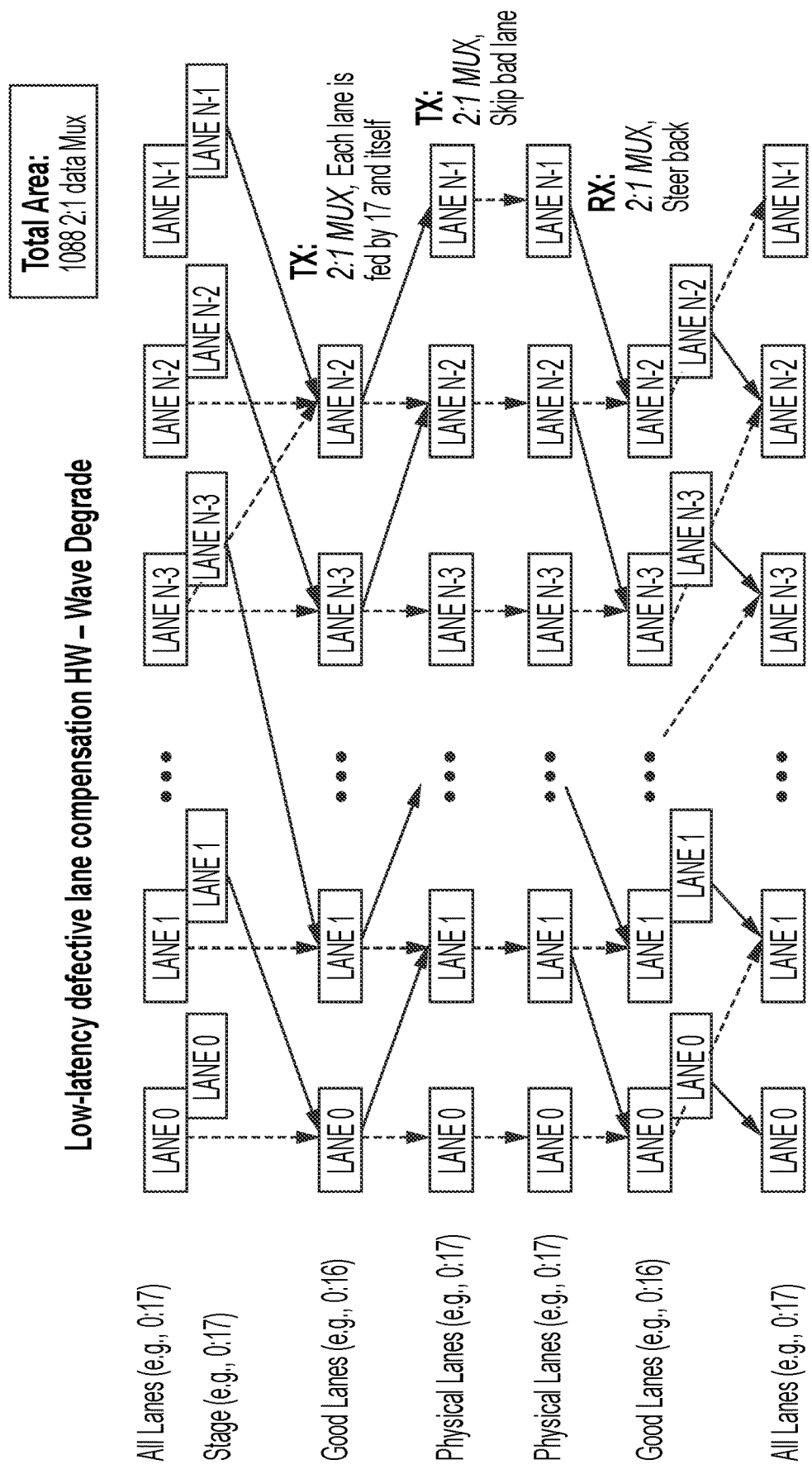
FIG. 12C depicts a diagram illustrating an example of how hardware of a low-latency HSS receiver that reroutes serialized data as depicted in FIG. 10 can be implemented in accordance with embodiments of the invention.

FIGS. 6-12C depicts additional details of how the defective lane compensation circuitry 210A, 210B (shown in FIG. 2) can be implemented in accordance with embodiments of the invention. More specifically, FIG. 6 is a table 600 that provides summaries and performance comparisons of various defective lane compensation techniques, including specifically the defective lane compensation techniques used in accordance with aspects of the invention. FIG. 7 is a diagram illustrating an example of how the HSS system 200 (shown in FIG. 2) manages serialized data traffic over multiple lanes when no lane is degraded. FIG. 8 is a diagram illustrating an example of how the HSS system 200 uses a novel lane compensation technique referred to herein as "read like a book" to manage serialized data traffic over multiple lanes when one lane is degraded. FIG. 9 is a diagram illustrating an example of how the HSS system 200 uses a novel lane compensation technique referred to herein as "ripple degrade" to manage serialized data traffic over multiple lanes when one lane is degraded. FIG. 10 is a diagram illustrating an example of how the HSS system 200 uses a novel lane compensation technique referred to herein as "wave degrade" to manage serialized data traffic over multiple lanes when one lane is degraded. FIG. 11 is a diagram that summarizes the hardware area savings realized by the "read like a book," "ripple degrade," and "wave degrade" techniques depicted in FIGS. 8-10. FIGS. 12A-12C depict example MUX layouts that support the hardware savings for the "read like a book," "ripple degrade," and "wave degrade" techniques depicted in FIGS. 8-10 and summarized in FIG. 11. Although the examples depicted in FIGS. 7-10 involve a single degraded line, each degraded lane compensation method described herein can be extended not only to a single lane degrade, but to two (2), three (3), four (4), or more lane degrades. There merely needs to be more shifting and displacement of lanes (according to the displacement pattern defined for the given method) for the lanes that cannot be processed on the first cycle. Additionally, it is noted that the various computations around hardware (HW) elements, RAS performance, bandwidth performance, and latency performance are based on an HSS system having the data structures (e.g., as shown in FIG. 1) and other parameters provided herein. These calculations are provided to illustrate performance results that can be obtained utilizing the various embodiments of the invention as described herein. Finally, the degraded lanes and the non-degraded lanes described herein can each be provided as a set, and each set can include a single lane or multiple lanes unless it is specifically stated to the contrary.

Turning now to FIG. 6, the table 600 compares various defective lane compensation techniques under several categories including RAS, Relative Area (i.e., HW logic area), Bandwidth Performance Impact, and Latency Performance Impact. In the first row of the table 600, the Degrade Support is "None," which provides a baseline for comparing the other Degrade Support options. As shown in the first row, when no degrade support is provided, a lane failure reduces RAS to zero (or "None"). The Relative Area, the Bandwidth Impact, and Latency Impact are shown as N/A because these are used for the base line comparisons for the other rows. A lack of degrade support is not generally suitable for high-reliable systems, for instance for enterprise cloud systems.

In the second row of the table 600, a known Spare Lane Reserved method for Degrade Support can be provided by reserving a spare lane that sits idle until a lane degrade occurs and all data from the degraded lane is rerouted to the spare lane. As shown in the second row, when Spare Lane degrade support is provided, RAS performance is GOOD, and low overhead for HW is required (some static MUX logic) in order to reroute traffic from a defective lane to a spare lane. However, this method does not take advantage of the possible bandwidth that the spare lane affords because the spare lane is only there for RAS. Bandwidth performance is reduced by 6% across all interfaces compared to utilizing all lanes for bandwidth. When there is a degrade, however, the system does not lose any Latency or Bandwidth Performance because the interface has already given up the performance potential on all interfaces. There is a slight circuit delay for the steering logic, which may or may not have an impact on latency.

As shown in the third row of the table 600, when "read like a book" degrade support is provided, RAS performance is GOOD, and it is estimated that about 9792 additional HW elements are required in order to reroute data under the "read like a book" technique. Bandwidth performance impact is zero across all interfaces and reduced by only about 6% for the bad lane. Finally, the latency performance impact under the "read like a book" technique is Moderate and driven by the need for many 18:1 MUX elements to implement the "read like a book" technique. In some embodiments of the invention, an extra staging cycle is added to the defective lane compensation circuitry 210A, 210B (shown in FIG. 2) to allow more time for the circuit latency.

As shown in the fourth row of the table 600, when "ripple degrade" degrade support is provided, RAS performance is GOOD, and it is estimated that about 1360 additional HW elements are required in order to reroute data under the "ripple degrade" technique. Bandwidth performance impact is zero across all interfaces and reduced by only about 6% for the bad lane. Finally, the latency performance impact under the "ripple degrade" technique is Slight and driven by the need for many 18:1 MUX elements to implement the "ripple degrade" technique. In some embodiments of the invention, an extra staging cycle is added to the defective lane compensation circuitry 210A, 210B (shown in FIG. 2) to allow for more time for the circuit latency. These stages are described in more detail later in the descriptions of FIGS. 12A, 12B, and 12C.

As shown in the fifth row of the table 600, when "wave degrade" degrade support is provided, RAS performance is GOOD, and it is estimated that about 1088 additional HW elements are required in order to reroute data under the "wave degrade" technique. Bandwidth performance impact is zero across all interfaces and reduced by only about 6% for the bad lane. Finally, the latency performance impact under the "wave degrade" technique is Slight and driven by the need for significantly fewer 18:1 MUX elements in comparison to the "ripple degrade" and "read like a book" techniques. In some embodiments of the invention, an extra staging cycle is added to the defective lane compensation circuitry 210A, 210B (shown in FIG. 2) to allow for more time for the circuit latency. The areas are provided as a relative data-routing overhead to be used as a rough comparison of areas. There is supplemental control logic that accompanies these areas that should scale to the numbers shown.

FIG. 7 depicts a table 700 that provides a more detailed illustration of the how data moves through physical lanes 0-17 when no lane degrade event has occurred, which means that any or all of the detective lane compensation techniques (read like a book, ripple degrade, and wave degrade) are available, but, because no lane failure event has occurred, none of the novel lane compensation techniques disclosed herein have been activated. The table 700 is organized in the following manner. Lanes are shown across the top row, and the cycle number (beats) is shown along the leftmost column. The received data type (RCV DATA) is shown along the rightmost column. Thus, during cycle zero (0), the data from left to right on lanes 0-17 are A0 on lane-0; A1 on lane-1; A2 on lane-2; A3 on lane-3; A4 on lane-4; A5 on lane-5; A6 on lane-6; A7 on lane-7; A8 on lane-8; A9 on lane-9; A10 on lane-10; A11 on lane-11; A12 on lane-12; A13 on lane-13; A14 on lane-14; A15 on lane-15; A16 on lane-16; and A17 on lane-17. The remaining rows/cycles of the table 700 track the same pattern as cycle-0.

FIG. 8 depicts a table 800, which provides a more detailed illustration of how data moves through physical lanes 0-16 when the rerouting pattern "read like a book" is applied. The table 800 is organized in substantially the same way as table 700 shown in FIG. 7, except one of the lanes is defective. Because there are many lanes, the combinations of defective lanes can grow exponentially when one or more lanes fail. Therefore, to allow a more scalable system for degraded lanes, the concept of logical vs. physical lanes is introduced. This concept of logical vs. physical lanes can be applied to all the degrade scenarios shown in FIGS. 8-10 as well as additional extensions. For instance, when applying "read like a book," "ripple degrade," or "wave degrade," the logical degrade can first be applied, followed by a specific physical degrade structure. The combined logical and physical distinctions are explained in more detail in in the descriptions of FIGS. 12A, 12B, and 12C.

In FIGS. 8, 9, and 10, it is assumed that any single lane degrade in a bus (e.g., n total lanes) can be manifested through physical steering logic shown in more detail in FIGS. 12A, 12B, and 12C into a compressed logical bus of r lanes (where r is the number of good lanes). In such a bus, good lanes are numbered as logical lanes 0 through r-1 and the remaining, unused, bad lanes can be numbered from logical lanes r through n-1 (or simply ignored). For the purposes of describing FIGS. 8, 9, and 10, the term "lane" can refer to a logical lane. By designing to a single logical lane mapping per defective lane, the combinations of mapping the three degrade methods shown in FIGS. 8, 9, and 10 are simplified into one design point per degrade method (rather than one design point per degrade per combinations of lanes).

Referring now to table 800 in FIG. 8, lanes are shown across the top row, and the cycle number is shown along the leftmost column. The received data type (RCV DATA) is shown along the rightmost column. Thus, during cycle zero (0), the data from left to right on lanes 0-16 are A0 on lane-0; A1 on lane-1; A2 on lane-2; A3 on lane-3; A4 on lane-4; A5 on lane-5; A6 on lane-6; A7 on lane-7; A8 on lane-8; A9 on lane-9; A10 on lane-10; A11 on lane-11; A12 on lane-12; A13 on lane-13; A14 on lane-14; A15 on lane-15; and A16 on lane-16. The data A17 that would have been on logical lane 17 is deferred into the next cycle. Because there is a defective lane, only 17 lanes out of 18 lanes can be used. The logical lane-17 is rerouted to the next lane, which is lane-0 in cycle-1. The remaining rerouting operations of the "read like a book" rerouting pattern are depicted in the remaining cycles shown in table 800. It is noted that on each cycle, the lanes are "shifted" by one more lane to the right on each iteration. Also, some of the delayed lanes are sent staged (i.e., stored in latches or registers and sent on a later cycle), while the data on the lower lane numbers are not staged. These staging registers are shown in more detail in FIG. 12A. Over time, more lanes are staged until, on cycle-17, all the data is sent out from the staged copy. Because of this, the staged register is fully used on that last cycle. The staging cannot load any new data (e.g., R) while holding the data from the prior cycle (e.g. Q). Therefore, there needs to be a gap introduced at cycle-17 to allow for the staging register to be empty again, thus allowing for new data to be brought in on cycle-18. Cycle-8 is equivalent to cycle-0 and the process repeats, where data R in cycle-18 would behave the same way as data A in cycle-0.

FIG. 9 depicts table 900, which provides a more detailed illustration of how data moves through physical lanes 0-16 when the rerouting pattern "ripple degrade" depicted in table 900 is applied. The table 900 is organized in substantially the same way as table 700 shown in FIG. 7, except logical lane 17 (the last lane in the cycle) is not shown. More specifically, lanes are shown across the top row, and the cycle number is shown along the leftmost column. The received data type (RCV DATA) is shown along the rightmost column. Thus, during cycle zero (0), the data from left to right on lanes 0-16 are A0 on lane-0; A1 on lane-1; A2 on lane-2; A3 on lane-3; A4 on lane-4; A5 on lane-5; A6 on lane-6; A7 on lane-7; A8 on lane-8; A9 on lane-9; A10 on lane-10; A11 on lane-11; A12 on lane-12; A13 on lane-13; A14 on lane-14; A15 on lane-15; and A16 on lane-16. The data A17 that would have been on the last logical lane (lane-17) during cycle-0 is staged for a cycle and used on the next cycle. Because lane-17 was not able to be sent on the prior cycle-0, lane-17 data is sent across lane-0. This is somewhat like "read like a book". However, instead of B0 being sent on that same cycle (cycle-1), it is held (because it was displaced by lane-17, the highest numbered lane). This allows data B1 to continue to be sent on lane-1 on cycle-1, similar to the non-defective case. In fact, B2-B16 can hold their same locations and cycles as they had on the scenario with no degrade, as shown in table 700 of FIG. 7. On cycle 2, because B0 has already been delayed by a cycle (being displaced by A17), it is important for B0 to be sent on cycle-2, to keep the latency of B at a minimum. Likewise, because B17 has no lane of its own (lane-17) and cannot occupy lane-0 (because B0 needs to be sent in cycle-2), then B17, already staged from cycle-1 to cycle-2, ripples over to lane-1, displacing C1 by a cycle. The rippling continues in a similar fashion, where the lanes higher than the displaced lane in cycle-1 continue to hold their place from the default assignments (i.e., C2-C16 in lane-2-lane-16, respectively). Starting with cycle-3, now C0, C1, and C17 have all been displaced. Accordingly, more lanes are staged on each subsequent cycle (similar to the "read like a book" scheme in FIG. 8). However, rather than all lanes being rotated to the right, only the highest, displaced logical lanes "ripple" through the lanes. After the ripple, the lane that was displaced simply sends data on its own lane, through its staged register (as depicted later in FIG. 12B).

With respect to the physical design nature of the "ripple" scheme, for a case where the lanes are spread out across 288 wires or regions, left-to-right, the 288 lanes (typically made up of 16 bits per lane×18 lanes) do not have a lot of crossing over to other regions. In fact, each lane can stay in its "bay" or region and only has to handle the situation of when to send the data hot on the wires (without delay) and when to stage the data before sending it. The only exception is the highest lane, lane-17. That lane will need to be sent across all the other lanes. In some embodiments of the invention, the rippled lane is normally the middle lane (rather than the highest lane) and will be sent across the rippled lanes, so its distance from its normal position and its worst case is ½ the width of the total bus. The remaining rerouting operations of the "ripple degrade" rerouting pattern are depicted in the remaining cycles shown in table 900.

FIG. 10 depicts a table 1000, which provides a more detailed illustration of how data moves through physical lanes 0-16 when the rerouting pattern "wave degrade" depicted in table 1000 is applied. It can be appreciated by those skilled in the art that physical constraints, such as placement, timing, wiring, performance, area, congestion, noise, and cross-talk, pose challenges when trying to plan for these wide buses over a degraded bus that has less capacity due to lane degrades. Considering the above-described challenges, the "wave degrade" function depicted in table 1000 of FIG. 10 can address these challenges by limiting lanes to one or two pitches left or right between a lane in normal operation and a lane that is part of a degraded bus. The "wave degrade" beneficially provides no more than one lane pitch shift for every bad lane in the design; no more than one additional cycle delay per packet is achieved compared to an undegraded case (not counting the gap cycle); and minimal wiring and muxing delay.

The table 1000 is organized in substantially the same way as table 700 shown in FIG. 7, except logical lane-17 (the last lane in the bus) is staged because there are 18 lanes of logical data and only 17 physical lanes over which to send them. More specifically, lanes are shown across the top row, and the cycle number is shown along the leftmost column. The received data type (RCV DATA) is shown along the rightmost column. Thus, during cycle zero (0), the data from left to right on lanes 0-17 are A0 on lane-0; A1 on lane-1; A2 on lane-2; A3 on lane-3; A4 on lane-4; A5 on lane-5; A6 on lane-6; A7 on lane-7; A8 on lane-8; A9 on lane-9; A10 on lane-10; A11 on lane-11; A12 on lane-12; A13 on lane-13; A14 on lane-14; A15 on lane-15; and A16 on lane-16. The data A17 that would have been sent on the last lane, lane-17, during cycle 0 is staged into the next cycle.

In order to satisfy the above-described beneficial feature of no more than one lane pitch as no more than one cycle delayed, the staged lane-17 data, A17, must be sent on lane-16 on cycle-1 (i.e., one cycle shifted and one cycle late). The remaining lanes, lane-0-lane-15 can send B0-B15, respectively, similar to the data transfer in can continue to be sent on lanes lane-0-lane15, without requiring staging. This is similar to how data are sent in table 700 in FIG. 7. The only data that cannot be accommodated on cycle-1 is B16 (the latest displaced lane due to A17) and B17 (more data that cannot be accommodated by the displaced logical lane-17).

On cycle-2, both B16 and B17 need to be sent (to satisfy the above-described beneficial feature of data can be staged no more than 1 cycle). Therefore, they can be sent on lane-15 and lane-16, respectively, which are precisely one bit pitch away from their original lane locations. Likewise, the remaining lanes, lane-0-lane-14 can send C0-C14, respectively. The remaining rerouting operations of the "wave degrade" rerouting pattern are depicted in the remaining cycles shown in table 1000. The cascading or shifting of one extra lane on each cycle resembles a wave, hence the name "wave degrade". This wave degrade continues until, on cycle 17, all 17 lanes, lane-0-lane 16 send delayed packet Q, Q1-Q17. Because of the displaced/delayed packet data, no new data can be sent across the interface on cycle-17. This is considered a "gap" cycle and the driver logic needs to throttle the incoming data to allow for the interface to recover the staging resources.

FIG. 11 is a diagram that summarizes the hardware area savings realized by the "read like a book," "ripple degrade," and "wave degrade" techniques depicted in FIGS. 8-10. All three schemes, "read like a book", "ripple degrade" and "wave degrade" allow for 17 packets to be sent over the degraded interface in 18 cycles. Furthermore, each method can be extended not only to a single lane degrade, but to 2, 3, 4, or more lane degrades. There merely needs to be more shifting and displacement of lanes (according to the displacement pattern defined for the given method) for the lanes that cannot be processed on the first cycle. There are also some convenient simplifications that can be done of the displaced lanes if the number of degraded lanes does not evenly divide into the total number of lanes. Accordingly, some liberties can be taken to reduce the logic, even if the maximum possible bandwidth is not 100% of the ideal bandwidth achievable.

FIGS. 12A-12C depict example MUX layouts that support the hardware savings for the "read like a book," "ripple degrade," and "wave degrade" techniques depicted in FIGS. 8-10 and summarized in FIG. 11. It is noted that the various computations around hardware (HW) elements, RAS performance, bandwidth performance, and latency performance are based on an HSS system have the data structures (e.g., as shown in FIG. 1) and other parameters provided herein. These calculations are provided to illustrate performance results that can be obtained utilizing the various embodiments of the invention as described herein.

In addition to the physical lane steering MUXes at the top and bottom of FIGS. 12A, 12B, and 12C, there are physical lane steering MUXes in the middle of the diagram to allow for steering around the one (or more) bad lanes. To illustrate this case, assume lane-1 is bad. The "read like a book", "ripple degrade", and "wave degrade" techniques all take the N lane scenario (N=18 for the examples herein) down to N-1 lanes (depicted at the top of FIGS. 12A-12C as Good Lanes 0:16), shown as blocks numbered LANE 0 to LANE N-2. Notice the expected number of wires feeding each of those boxes varies, depending on the technique. The corresponding number of MUX inputs varies, examples of which include 18:1 for FIG. 12A, 2:1 for FIG. 12B, and 2:1 for FIG. 12C.

After getting the logical bus to fit in LANE 0 to LANE N-2, the physical steering MUXs are identical for FIG. 12A, FIG. 12B, and FIG. 12C. Turning to FIG. 12A, assume by example that lane-1 is the physically bad lane. Mapping from Good Lanes to Physical Lanes means that the LANE 0 Physical MUX chooses logical lane-0. That is because the logical lanes are all good. Thus, because logical lane-0 has good data, that data can be sent on good lane LANE 0. LANE 1 is bad. Therefore, it really does not matter what is sent on LANE 1. In some embodiments of the invention, the bad lane gets physical zero data, because it does not matter. Logical lane-1 shows up in FIG. 12A as Good Lanes LANE 1. Because Physical Lane LANE 1 is bad, then the lane-1 data must be steered to Physical LANE 2. Thus, there is a shift right of Good Lanes LANE 1 to Physical Lanes LANE 2. All other lanes, Good Lanes LANE 2-Good Lanes LANE N-2, get shifted right by one to Physical Lanes LANE 3-Physical Lanes LANE N-1. Now, all Physical lanes are carrying good logical data, except for the bad lane (in this case, Physical LANE 1).

The lane degrade compensation techniques depicted in FIGS. 12A-12C have a wide range of applications. For instance, steering around any degraded physical lane can be solved by applying the correct shifting to the various MUXes in the defective lane compensation hardware shown in FIGS. 12A-12C. Furthermore, extending the MUX structures in FIGS. 12A-12C to allow for more than one physical lane shift to handle multiple lane degrades can also be implemented by one skilled in the art using the guidance provided in this detailed description.

Figure 13:
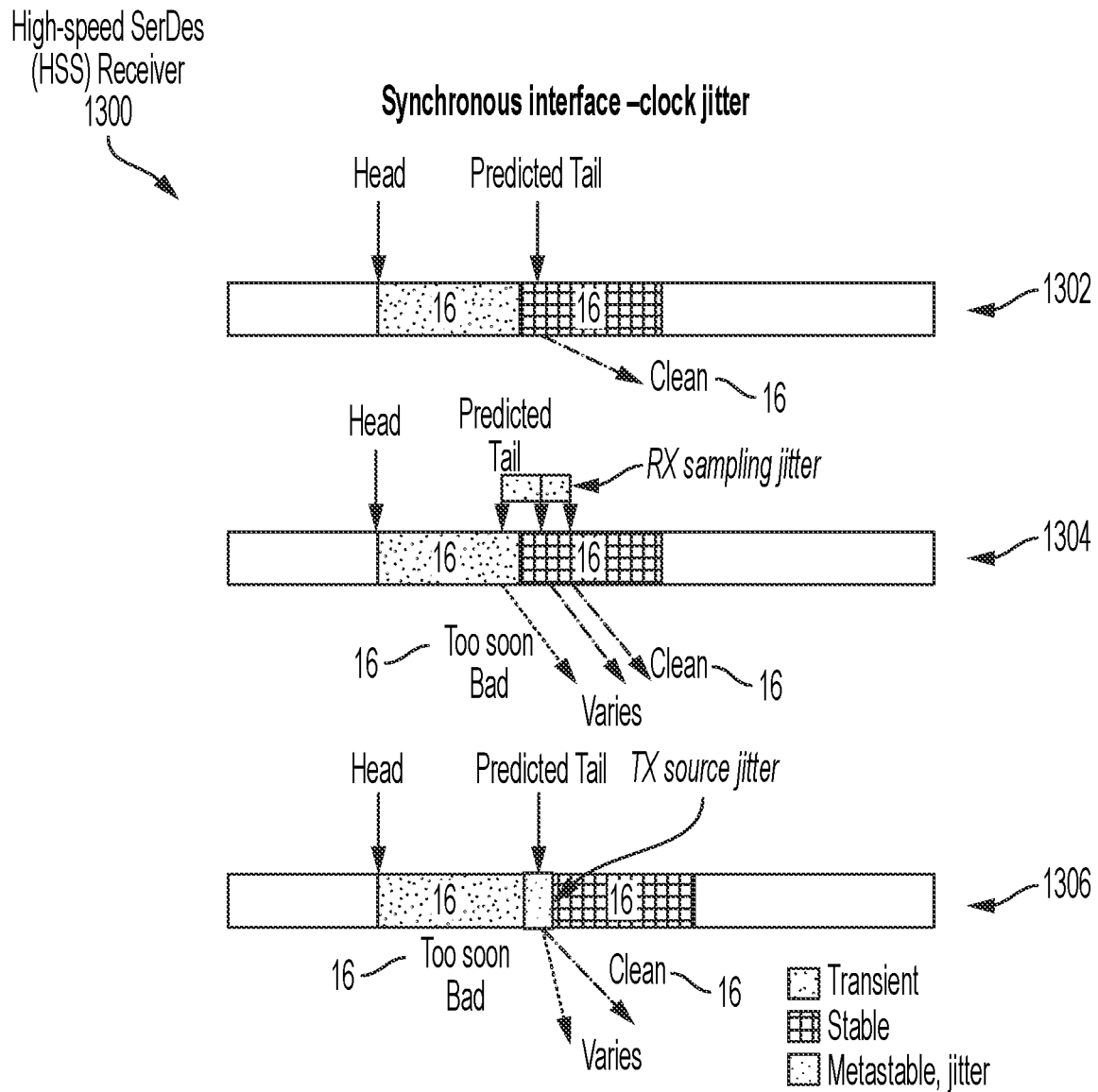
FIG. 13 depicts block diagrams illustrating examples of clock jitter in a low-latency HSS receiver that can be addressed by embodiments of the invention.
Figure 14:
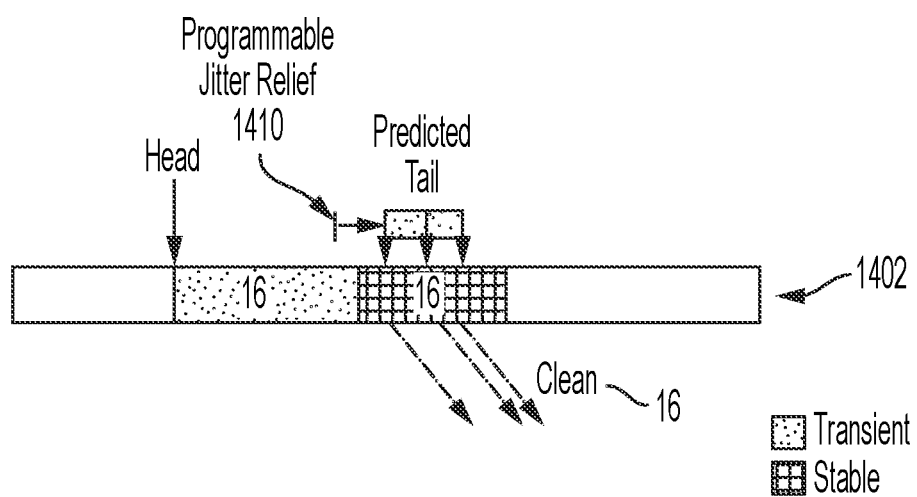
FIG. 14 depicts a block diagram illustrating programmable clock jitter relief in a low-latency HSS receiver in accordance with embodiments of the invention.
Figure 15:
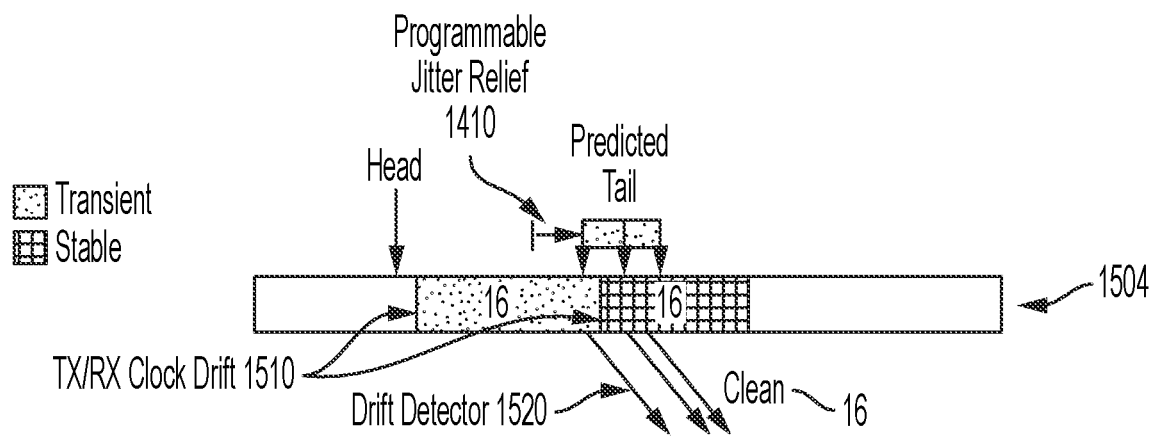
FIG. 15 depicts block diagrams illustrating examples of how clock drift can be detected in accordance with embodiments of the invention.

FIGS. 13-15 depict features of a programmable jitter relief function 1410 (shown in FIG. 14) in accordance with embodiments of the invention, along with a drift detection function 1520 (shown in FIG. 15) in accordance with embodiments of the invention. Turning first to FIG. 13, a simplified diagram illustrates how portions of a high-speed SerDes (HSS) Receiver 1300 can process a data stream 1302, which corresponds to the serialized overhead/data stream 102 (shown in FIGS. 1-3A). The data stream 1302 depicts adjacent 16-bit data segments of the stream 1302. As shown, the Head represents a time when 16 new data bits come into a FIFO register in a particular clock domain operating at a certain rate. Moving left to right, the first 16-bit data segment comes into a FIFO and is sitting in one of the FIFO registers, and the second segment represents a next 16 bit segment that needs to come into a next available FIFO register. In some embodiments of the invention, sync headers are removed from the consecutive 16-bit streams prior to detecting clock jitter or clock drift. The predicted tail is a prediction of when the first 16-bit segment sitting in the register has been loaded and stable and confirmed as clean data. In general, jitter can be defined as a variation in the delay of received data packets. At a transmitter, data segments are sent in a continuous stream with the segments spaced evenly apart. Due to clock jitter, data noise, signal issues, varying circuit delays over time, and other factors, this steady stream can become "lumpy", or the delay between each packet can vary instead of remaining constant. This variation or jitter occurs within a time window (e.g., the predicted tail shown in FIG. 13) and the specific values of jitter delay at any given moment tends to oscillate back and forth within the predicted tail window.

Because the predicted tail can itself move, and, in accordance with aspects of the invention, a programmable jitter relief technique 1410 shown in FIG. 14 can be used to make sure that the predicted tail occurs after a complete data segment (e.g., data segment 112A1 shown in FIG. 1) has been received, which allows the receiver to capture and sample a complete data segment. However, even if the receiver clock and the transmitter clock run at the same frequency, there will be some oscillation of the predicted tail within a window, which is shown by data stream 1304. If the predicted tail window extends partially over the first 16-bit data segment, and the predicted tail shows up too soon, receiver sampling can occur before the first 16-bit segment is stable. Data stream 1306 depicts an example in which the source of jitter is on the transmitter side where data may show up too late, compared to the predicted tail.

FIG. 14 depicts a proposed solution to the problem illustrated in FIG. 13 by providing programmable jitter relief technique 1410 configured to utilize buffering to push the predicted tail window to a time window when only clean data will be sampled. In accordance with aspects of the invention, a jitter window having a time that is controlled using buffering applied under the influence of the programmable jitter relief technique 1410 can be implemented in any suitable way using well-known buffering techniques. In embodiments of the invention, the buffering used by the programmable jitter relieve technique 1410 performs predictably as long as the transmitter and receiver clock frequencies are synchronous.

If the transmitter and receiver clocks are not synchronous, an out-of-sync condition exists, which is represented by TX/RX clock drift 1510. In accordance with aspects of the invention, a drift detection technique 1520 shown in FIG. 15 is configured to detect the out-of-sync conditions. The drift detection technique 1520 uses known techniques to analyze the behavior of the predicted tail window to determine that a transmitter clock frequency and a receiver clock frequency are drifting apart (e.g., TX/RX clock drift 1510) based on the movement of a predicted tail window. In embodiments of the invention, the drift detection technique 1520 evaluates the movement of the predicted tail window (with or without the programmable jitter relief technique 1410) to determine whether the movement of the window is sufficiently large to indicate that the "drift" may be occurring, and the most likely cause of drift is a misalignment between the frequency of the transmitter clock and the receiver clock (i.e., TX/RX clock drift 1510). As previously described herein, the drift detection event is evaluated at decision block 408 of the methodology 400 (shown in FIG. 4) using a pass/fail standard tailored for the nature of the particular drift detection technique being used (e.g., drift detection 1520).

Figure 16A:
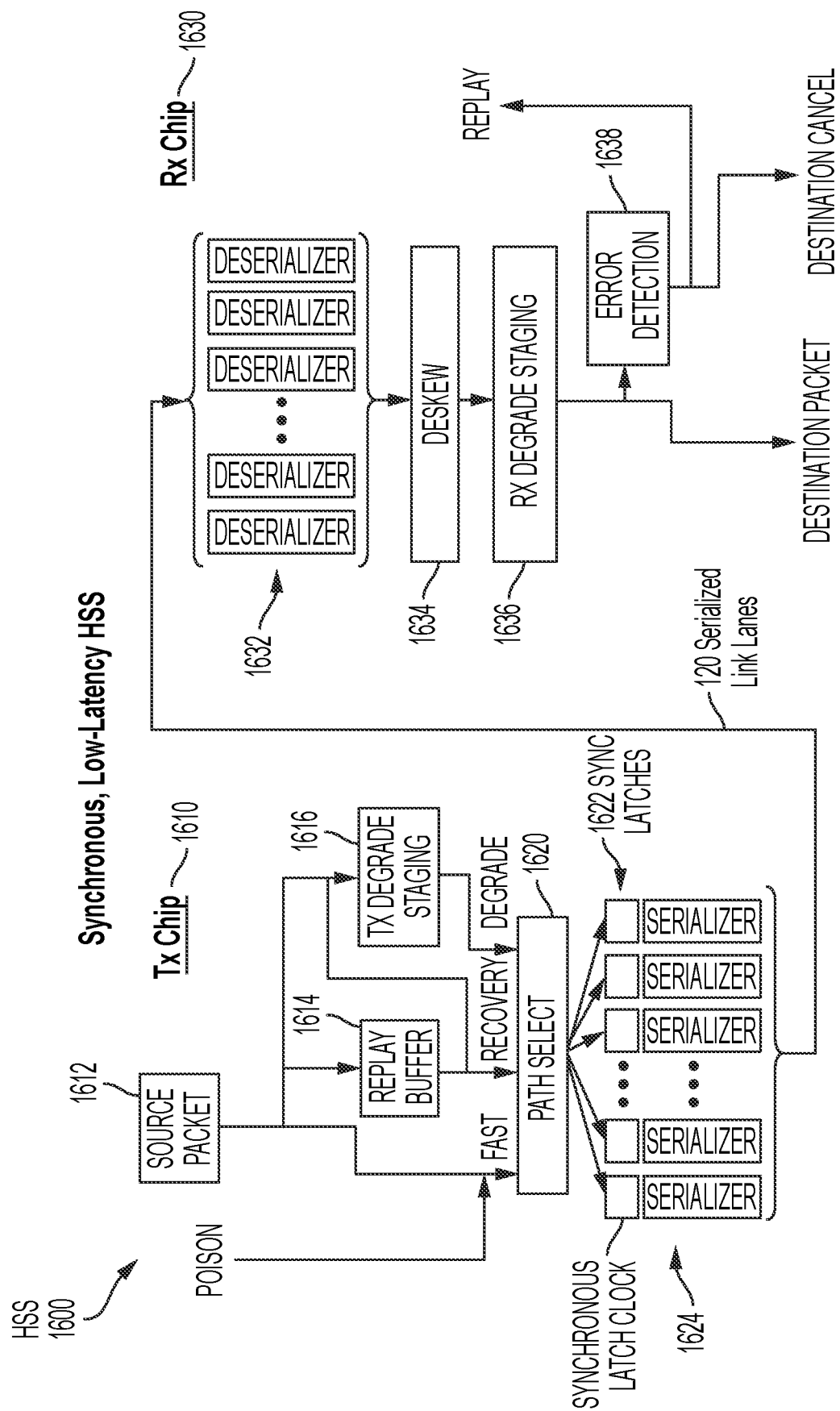
FIG. 16A depicts a block diagram illustrating a low-latency HSS system in accordance with embodiments of the invention.

FIG. 16A depicts a synchronous HSS system 1600, which provides additional details of how the HSS system 200 (shown in FIG. 2) can be implemented. As shown, the Tx chip 1610 corresponds to the Tx chip 220 (shown in FIG. 2), and the Rx chip 1630 corresponds to the Rx chip 240 (shown in FIG. 2). The Tx chip 1610 includes a source packet 1612, a replay buffer 1614, a Tx degrade staging circuit 1616, a path select 1620, sync latches 1622, and a set of serializers 1624, configured and arranged as shown. The Rx chip 1630 includes a set of deserializers 1632, a deskew circuit 1634, an Rx degrade staging circuit 1636, and an error detection circuit 1638 configured and arranged as shown. In accordance with embodiments of the invention, the HSS system 1600 includes sufficient circuitry to implement all operations of the HSS system 200 as described herein. The HSS system 1600 includes circuitry that provides multiple data paths at multiple latencies. The FAST data path is what normally runs when there are no data error problems and no degraded lane events. The DEGRADE path is invoked when there is a problem with some aspect of one or more transmission lanes that is sufficient to prevent the lanes from conducting serialized data. In accordance with embodiments of the invention, the DEGRADE path can be implemented in a manner that executes the defective lane compensation circuits 210A, 210B (shown in FIG. 2). The RECOVERY path is used when a problem is detected with serialized data (e.g., through CRC analysis) and the serialized data traffic needs to be retransmitted (e.g., resending a clean copy of the data from a replay buffer 1614 via path select 1620 through the HSS serialized link lanes 120 a second time). Embodiments of the invention include a use of a POISON command; a REPLAY command (e.g. detected by error detection circuit 1638); a RECOVERY path without degrade; or a DEGRADE recovery path using the replay buffer 1614, Tx degrade staging circuit, and Rx degrade staging circuit to allow replay data to cross degraded serialized link lanes 102. Embodiments of the invention include additional nuances and combinations of these features.

Figures 16B, 16C:
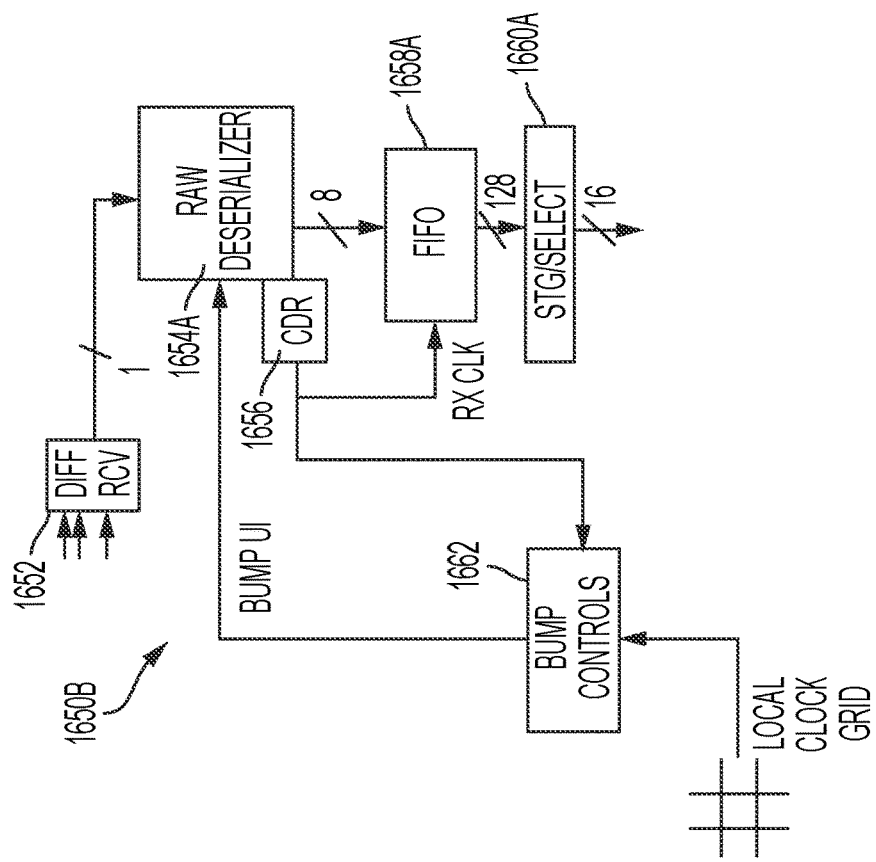
FIG. 16B depicts a block diagram illustrating a low-latency HSS receiver in accordance with embodiments of the invention.
FIG. 16C depicts a block diagram illustrating a low-latency HSS receiver in accordance with embodiments of the invention.

FIG. 16B depicts a synchronous HSS deserializer 1650A having a 16:1 deserialization ratio (i.e., 16-way), which provides additional details of how the HSS receiver 500A (shown in FIG. 5A) can be implemented. FIG. 16C depicts a synchronous HSS deserializer 1650B having an 8:1 deserialization ratio, which provides additional details of how the HSS receivers 500B and 500B' (shown in FIGS. 5A and 5C) can be implemented. As shown in FIG. 16B, the HSS deserializer 1650A includes a differential receiver 1652, a raw deserializer 1654, a CDR circuit 1656, a FIFO 1658, a staging select circuit 1660, and a bump controls circuit 1662, configured and arranged as shown. As shown in FIG. 16C, the HSS deserializer 1650B includes a differential receiver 1652, a raw deserializer 1654A, a CDR circuit 1656, a FIFO 1658A, a staging select circuit 1660A, and a bump controls circuit 1662, configured and arranged as shown. In accordance with embodiments of the invention, the HSS systems 1650A, 1650B includes sufficient circuitry to implement all operations of the HSS receives 500B and 500B' as described herein.

Figure 16D:
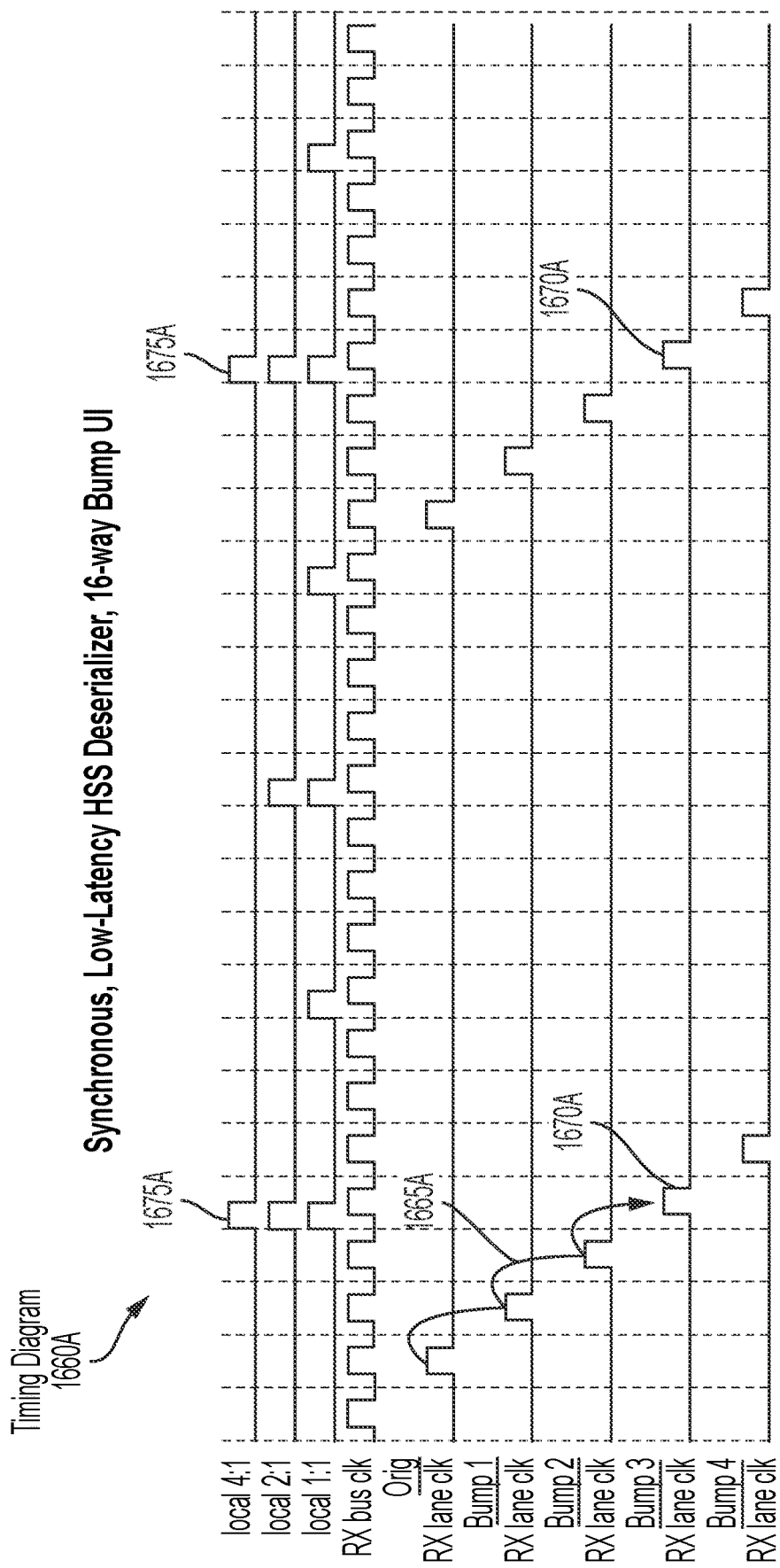
FIG. 16D depicts a timing diagram illustrating various signals states with "bump UI" of the low-latency HSS receiver shown in FIG. 16B.
Figure 16E:
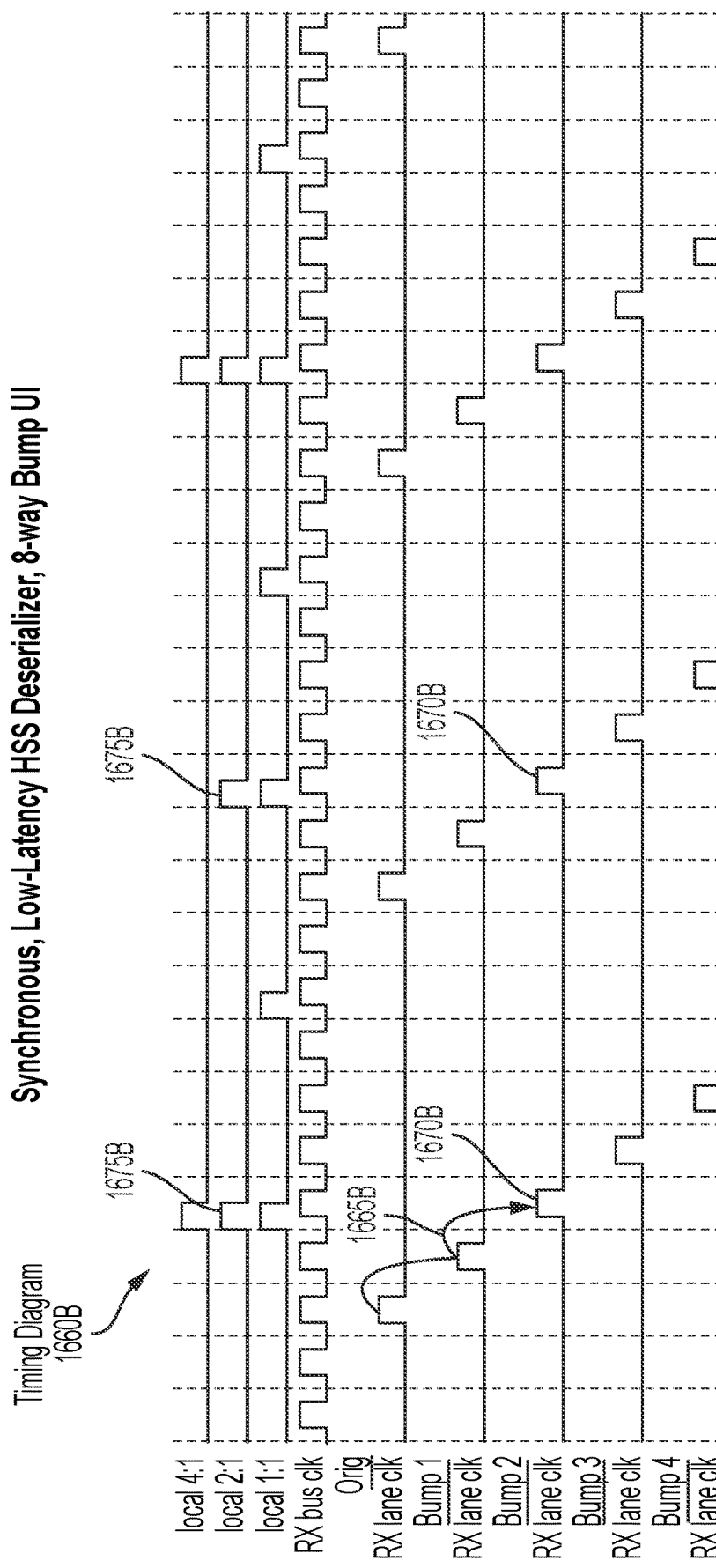
FIG. 16E is a timing diagram illustrating various signal states with "bump UI" of the low latency HSS receiver shown in FIG. 16C.
Figure 16F:
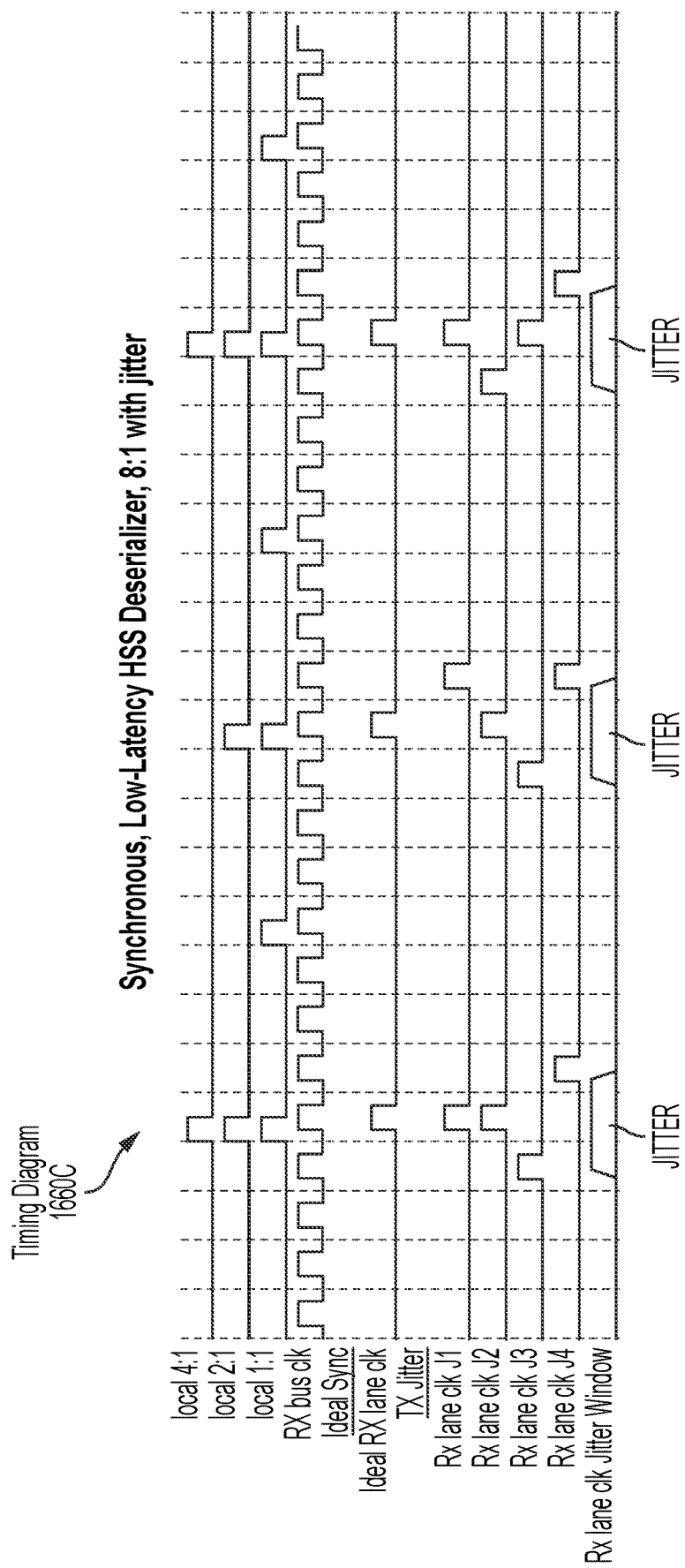
FIG. 16F depicts a timing diagram illustrating various signal states with Jitter of the low-latency HSS receiver shown in FIG. 16C.
Figure 16G:
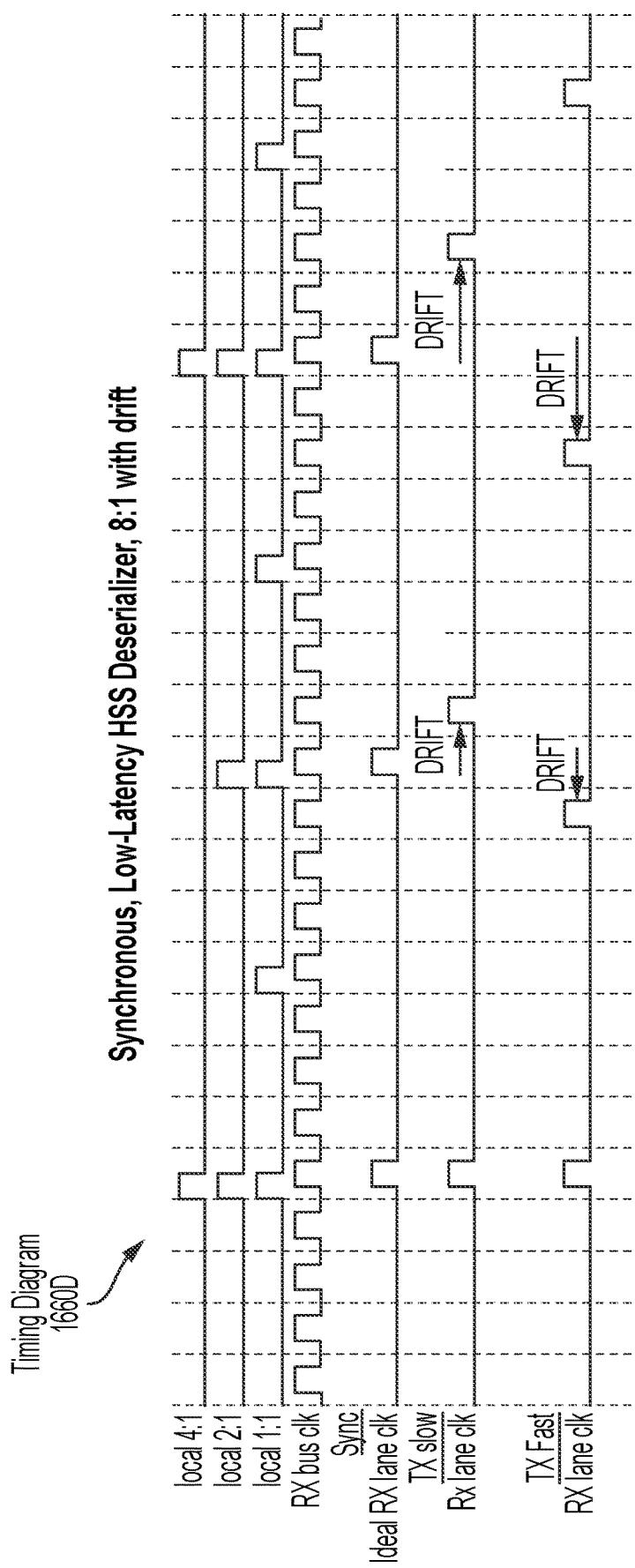
FIG. 16G depicts a timing diagram illustrating various signal states with Drift of the low-latency HSS receiver shown in FIG. 16C.

FIGS. 16D-16G depict timing diagrams that show waveforms associated with the HSS receivers 1650A, 1650B (shown in FIGS. 16B and 16C). More specifically, FIG. 16D depicts a timing diagram illustrating various signals states with bump UI of the low-latency HSS receiver 1650A shown in FIG. 16B; FIG. 16E is a timing diagram illustrating various signal states with bump UI of the low latency HSS receiver 1650B shown in FIG. 16C; FIG. 16F depicts a timing diagram illustrating various signal states with Jitter of the low-latency HSS receiver 1650B shown in FIG. 16C;

and FIG. 16G depicts a timing diagram illustrating various signal states with Drift of the low-latency HSS receiver 1650B shown in FIG. 16C.

Referring generally to FIGS. 16D-16G, the local clocks are the receiver clock that is used across the receiver chip after passing through the HSS interface. Because there is always a relative relationship between a Driver and Receiver, all these diagrams are shown with a consistent, fixed, receiver clock frequency and phase. The local 1:1 refers to a 1:1 clock with respect to a grid. This can typically be around 5-6 GHz and often represents a core clock. Local 2:1 refers to a synchronous clock that is used for slower circuits that do not have to run at core speeds. These clocks have a divider circuit to run at 2× the period of the core/grid (hence 2:1), which is half the frequency of a 1:1 clock. This clock is often referred to as a local fast nest clock. It is not as fast as the core or the HSS, but it is the faster of the two nest clocks. Local 4:1 refers to a synchronous clock that is used for very slow paths and circuits that do not have to run at core speeds or even fast nest speeds. These clocks have a divider circuit to run at 4× the period of the core/grid (hence 4:1), which is ¼ the frequency of a 1:1 clock. This is often referred to as a local slow nest clock. RX Bus clk refers to the local recaptured or regenerated or recovered clock (output of CDR). This is running at 1:1 with the bus. It should be noted that all of the RX bus clock and the Rx lane clks are not necessarily aligned to the local clock. Accordingly, the 5th pulse could appear with any alignment compared to the local 1:1, 2:1, and 4:1 clocks. All of the other waves in FIGS. 16D-16G can be equally offset. "RX lane clk" corresponds to the "Rx clk" shown in FIG. 2.

FIG. 16D depicts a 16-way local clock. There are 16 of the RX bus clock pulses for every RX clk pulse. Each Bump will shift the RX lane clk by one RX bus cycle. Eventually, the clocks will align (somewhat, but not exactly) with the Local 4:1, 2:1, and 1:1 pulses. For example, FIG. 16D needs 3 bumps 1665A to align its clock 1670A to the local clocks. Once aligned, the RX clk pulse 1670A aligns closely (within one bump or UI) with the local 4:1 clock 1675A.

FIG. 16E shows an 8-way local clock. There are 8 of the RX bus clock pulses for every RX lane clk pulse. Each Bump will shift the RX lane clk by one RX bus clk cycle. Eventually, the clocks will align (somewhat, but not exactly) with the Local 4:1, 2:1, and 1:1 pulses. For example, FIG. 16E needs 2 bumps 1665B to align its clock 1670B to the local clocks. Once aligned, the RX clr pulse 1670B aligns closely (within one bump or UI) with the local 2:1 clock 1675B.

FIG. 16F shows an 8-way local clock, similar to FIG. 16E. The ideal RX lane clk is shown (assuming no jitter). However, in practice, there would be relative jitter on the RX bus clock compared to the local clocks. This jitter is demonstrated by example with RX lane clk J1-J4. They are shown as exactly one cycle earlier or later than the ideal clock (Ideal RX lane clk), however, they can vary by any amount over time based on jitter/delay variability. The last waveform is labeled as the Rx lane clk Jitter Window and shows the min/max jitter window for a typical clock over time for each cycle of that clock.

FIG. 16G is similar to FIG. 16F. However, in FIG. 16G, the ideal RX lane clk is shown (assuming no jitter and no clock drift), and two examples of clock drift are provided. The Tx Slow version of Rx lane clk shows a case where the Rx lane clk (compared to the local clocks) has a longer clock period. Thus, it drifts in time to the right in its waveform. The Tx Fast version of the Rx lane clk shows a case where the Rx lane clk (compared to the local clocks) has a shorter clock period. Thus, it drifts in time to the left in its waveform.

Figure 17:
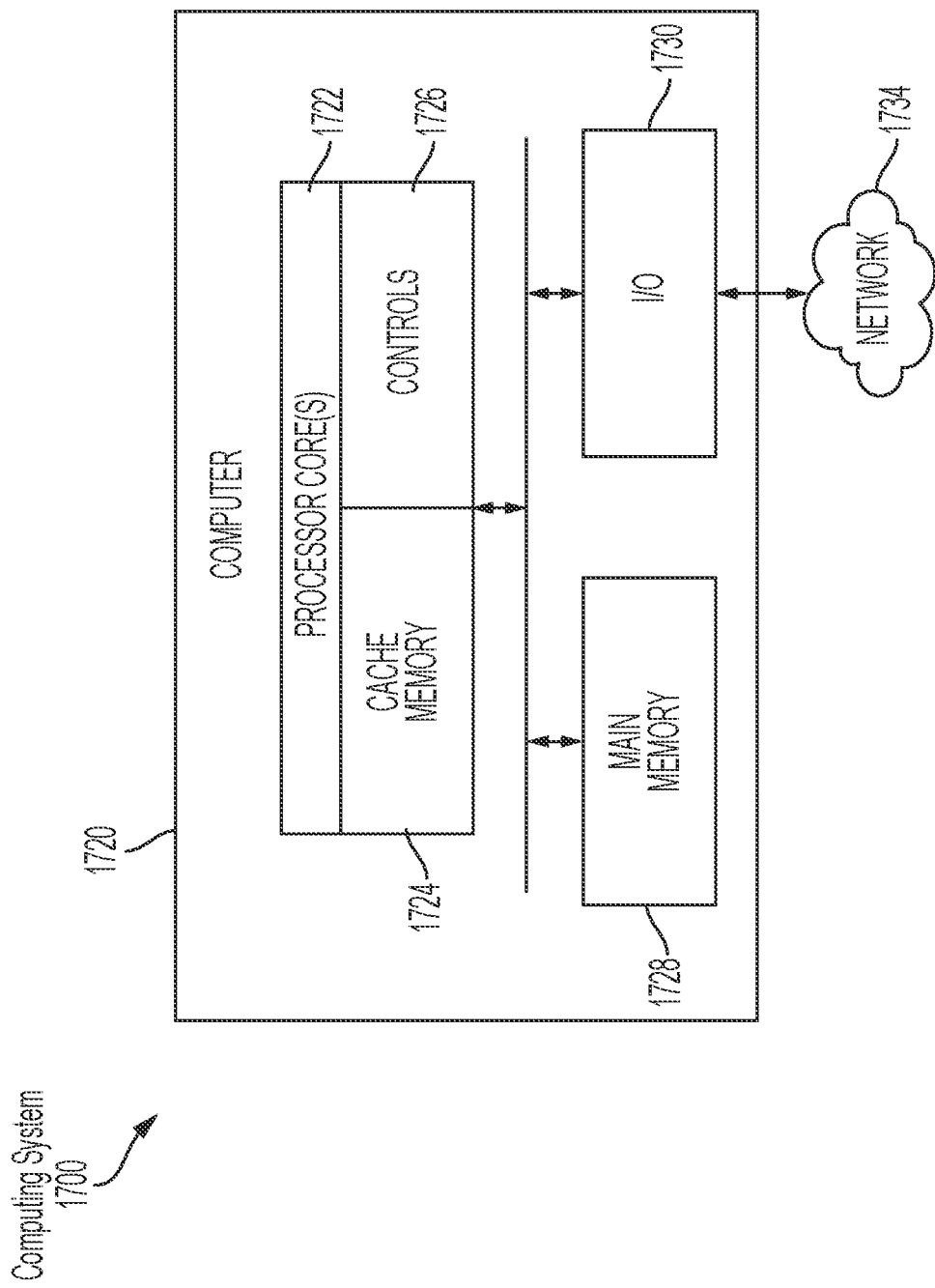
FIG. 17 depicts a computing system capable of implementing embodiments of the invention.

FIG. 17 illustrates an example of a computer system 1700 that can be used to implement any of the computer-based components of the various embodiments of the invention described herein. The computer system 1700 includes an exemplary computing device ("computer") 1702 configured for performing various aspects of the content-based semantic monitoring operations described herein in accordance aspects of the invention. In addition to computer 1702, exemplary computer system 1700 includes network 1714, which connects computer 1702 to additional systems (not depicted) and can include one or more wide area networks (WANs) and/or local area networks (LANs) such as the Internet, intranet(s), and/or wireless communication network(s). Computer 1702 and additional system are in communication via network 1714, e.g., to communicate data between them.

Exemplary computer 1702 includes processor cores 1704, main memory ("memory") 1710, and input/output component(s) 1712, which are in communication via bus 1703. Processor cores 1704 includes cache memory ("cache") 1706 and controls 1708, which include branch prediction structures and associated search, hit, detect, and update logic, which will be described in more detail below. Cache 1706 can include multiple cache levels (not depicted) that are on or off-chip from processor 1704. Memory 1710 can include various data stored therein, e.g., instructions, software, routines, etc., which, e.g., can be transferred to/from cache 1706 by controls 1708 for execution by processor 1704. Input/output component(s) 1712 can include one or more components that facilitate local and/or remote input/output operations to/from computer 1702, such as a display, keyboard, modem, network adapter, etc. (not depicted).

FIG. 18 is a block diagram of a system 1800 to perform low-latency HSS operations according to embodiments of the invention. The system 1800 includes processing circuitry 1810 used to generate the design that is ultimately fabricated into an integrated circuit 1820. The steps involved in the fabrication of the integrated circuit 1820 are well-known and briefly described herein. Once the physical layout is finalized, based, in part, on the low-latency HSS operations according to embodiments of the invention to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 19.

Figure 19:
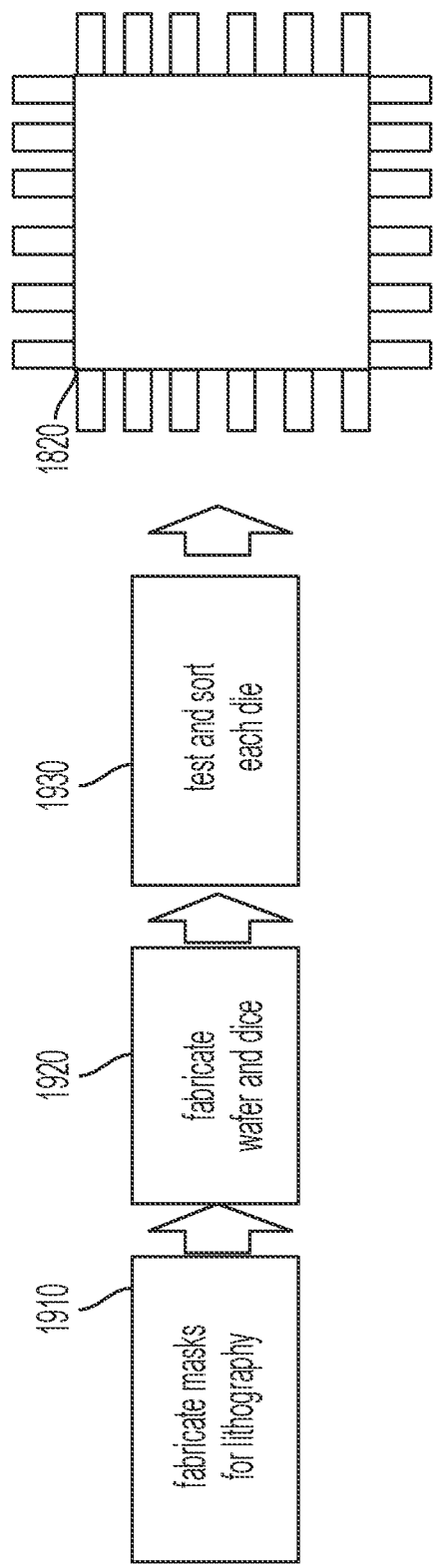
FIG. 19 is a process flow of a method of fabricating an integrated circuit capable of implementing embodiments of the invention.

FIG. 19 is a process flow of a method of fabricating the integrated circuit according to exemplary embodiments of the invention. Once the physical design data is obtained, based, in part, on the low-latency HSS in accordance with embodiments of the invention, the integrated circuit 1820 can be fabricated according to known processes that are generally described with reference to FIG. 19. Generally, a wafer with multiple copies of the final design is fabricated and cut (i.e., diced) such that each die is one copy of the integrated circuit 1820. At block 1910, the processes include fabricating masks for lithography based on the finalized physical layout. At block 1920, fabricating the wafer includes using the masks to perform photolithography and etching. Once the wafer is diced, testing and sorting each die is performed, at block 1930, to filter out any faulty die.

Thus, it can be seen from the forgoing descriptions that a embodiments of the invention provide technical effects and benefits. For example, the automated synchronization modes functionality disclosed herein allows an HSS system to continue operating when failure modes occur that no longer allow the HSS system to serialize, transmit, and deserialize data synchronously. More specifically, the automated synchronization modes functionality is configured to, automatically, switch the HSS system to a non-synchronous operating mode when it is determined that there is some issue that is preventing the HSS system from operating synchronously, then automatically return the HSS system to synchronous operation mode when it is determined that there is no longer an issue preventing the HSS system from operating synchronously. The automated synchronization modes functionality further includes diagnosis functionality that allows it to diagnose the source of the non-synchronous operation, and some portions of the diagnosis are not performed until after the HSS system is in a non-synchronous operation mode. Performing the diagnosis while the HSS system is operating in a non-synchronous mode is beneficial in that the complexity of both the diagnosis and any problem-mitigation strategies (e.g., defective lane compensation) that are invoked is greatly reduced when the HSS system is operating in a non-synchronous mode.

Technical effects and benefits are also provided by the defective lane compensation circuitry and the fine-granularity deserialization techniques disclosed herein. In some embodiments of the invention, the fine-granularity deserialization includes sub-packet optimization techniques. The defective lane compensation circuitry enables an HSS system to continue operating when failure modes occur that no longer allow the HSS system to serialize, transmit, and deserialize data synchronously due to a lane degrade event. In accordance with embodiments of the invention, the defective lane compensation circuits implement various novel techniques for rerouting transmitted/received data when an instance of the various data transmission lanes of the HSS system malfunctions and no longer transmits data. Rather than provide wasteful spare lanes and/or spare cycles that remain idle until a transmission lane malfunctions, the defective lane compensation circuitry in accordance with embodiments of the invention utilize data re-routing logic that enables the functioning lanes to transmit data that has been re-routed from the defective lane, thereby enabling the functioning transmission lanes to process more data than they were originally designed to process.

In accordance with aspects of the invention, the fine-granularity deserialization functionality utilizes a data deserialization ratio that is more granular (e.g., an 8:1 deserialization ratio) than the serialization ratio (e.g., a 16:1 serialization ratio). Accordingly, the fine-granularity deserialization function enables the deserializer of the HSS system to load and use deserialized data sooner, which improves latency performance of the HSS system. The fine-granularity FIFO structure and register loading logic of the HSS system's receiver can be augmented by also providing a sub-packet reorganization function that can be configured to place a data stream on a link lane connecting the transmitter and the receiver of the HSS system in "sub-packets" or "action groups," wherein the segments that form the action group are in sequential order in the data stream. Because the action group segments are in sequential order, they can be concentrated at the leading end of the FIFO registers so the HSS system only has to wait until the leading FIFO registers are full with the action group segments before the action group segments can be sampled and used.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be understood that those skilled in the art, both now and in the future, may make various improvements and enhancements which fall within the scope of the claims which follow.

What is claimed is:

1. A computer-implemented method of automatically determining an operation mode of a data transmission system, the data transmission system comprising a transmitter and a receiver, the computer-implemented method comprising:
   using the transmitter to send data from the transmitter through a plurality of lanes to the receiver using a synchronous operation mode;
   wherein the synchronous operation mode comprises sending the data from the transmitter through the plurality of lanes to the receiver in a synchronous transmission manner that relies on an alignment between a transmitter clock frequency and a receiver clock frequency;
   performing, using a processor system, a synchronous operation performance analysis (SOPA) on the data transmission system while the data transmission system is operating in the synchronous operation mode;
   switching the data transmission system from the synchronous operation mode to an asynchronous operation mode based on at least in part on a result of performing the SOPA;
   wherein the asynchronous operation mode comprises sending the data from the transmitter through the plurality of lanes to the receiver without requiring alignment between the transmitter clock frequency and the receiver clock frequency; and
   performing, using the processor, an asynchronous operations performance analysis (AOPA) on the data transmission system while the data transmission system is operating in the asynchronous operation mode;
   wherein the AOPA comprises a lane-degrade analysis (LDA).

2. The computer-implemented method of claim 1, wherein the AOPA further comprises performing a data traffic analysis on the plurality of lanes.

3. The computer-implemented method of claim 1 further comprising switching the data transmission system from the asynchronous operation mode to the synchronous operation mode based at least in part on a result of performing the AOPA.

4. The computer-implemented method of claim 1, wherein the SOPA comprises an out-of-sync detection operation.

5. The computer-implemented method of claim 1 further comprising retraining the plurality of lanes to operate in the synchronous operation mode prior to switching the data transmission system from the asynchronous operation mode to the synchronous operation mode.

6. The computer-implemented method of claim 1, wherein the data comprises serialized data that has been converted from parallel data.

7. The computer-implemented method of claim 1 further comprising initiating a defective lane compensation operation based at least in part on a result of performing the LDA.

8. A computer system for automatically determining an operation mode of a data transmission system, the data transmission system comprising a transmitter and a receiver, the computer system comprising a memory communicatively coupled to a processor, wherein the processor is configured to implement processor operations comprising:
   controlling the transmitter to send data from the transmitter through a plurality of lanes to the receiver using a synchronous operation mode;
   wherein the synchronous operation mode comprises sending the data from the transmitter through the plurality of lanes to the receiver in a synchronous transmission manner that relies on an alignment between a transmitter clock frequency and a receiver clock frequency;
   performing a synchronous operation performance analysis (SOPA) on the data transmission system while the data transmission system is operating in the synchronous operation mode;
   switching the data transmission system from the synchronous operation mode to an asynchronous operation mode based on at least in part on a result of performing the SOPA;
   wherein the asynchronous operation mode comprises sending the data from the transmitter through the plurality of lanes to the receiver without requiring alignment between the transmitter clock frequency and the receiver clock frequency; and
   performing an asynchronous operations performance analysis (AOPA) on the data transmission system while the data transmission system is operating in the asynchronous operation mode;
   wherein the AOPA comprises a lane-degrade analysis (LDA).

9. The computer system of claim 8, wherein the AOPA further comprises performing a data traffic analysis on the plurality of lanes.

10. The computer system of claim 8, wherein the processor operations further comprise switching the data transmission system from the asynchronous operation mode to the synchronous operation mode based at least in part on a result of performing the AOPA.

11. The computer system of claim 8, wherein the SOPA comprises an out-of-sync detection operation.

12. The computer system of claim 8, wherein the processor operations further comprise retraining the plurality of lanes to operate in the synchronous operation mode prior to switching the data transmission system from the asynchronous operation mode to the synchronous operation mode.

13. The computer system of claim 8, wherein the data comprises serialized data that has been converted from parallel data.

14. The computer system of claim 8, wherein the processor operations further comprise initiating a defective lane compensation operation based at least in part on a result of performing the LDA.

15. A computer program product for automatically determining an operation mode of a data transmission system, the data transmission system comprising a transmitter and a receiver, the computer program product comprising a computer readable program stored on a computer readable storage medium, wherein the computer readable program, when executed on the processor, causes the processor to perform a method comprising:
   controlling the transmitter to send data from the transmitter through a plurality of lanes to the receiver using a synchronous operation mode;
   wherein the synchronous operation mode comprises sending the data from the transmitter through the plurality of lanes to the receiver in a synchronous transmission manner that relies on an alignment between a transmitter clock frequency and a receiver clock frequency;
   performing a synchronous operation performance analysis (SOPA) on the data transmission system while the data transmission system is operating in the synchronous operation mode; and
   switching the data transmission system from the synchronous operation mode to an asynchronous operation mode based on at least in part on a result of performing the SOPA;

wherein the asynchronous operation mode comprises sending the data from the transmitter through the plurality of lanes to the receiver without requiring alignment between the transmitter clock frequency and the receiver clock frequency; and performing an asynchronous operations performance analysis (AOPA) on the data transmission system while the data transmission system is operating in the asynchronous operation mode;

wherein the AOPA comprises a lane-degrade analysis (LDA).

16. The computer program product of claim 15, wherein the AOPA further comprises performing a data traffic analysis on the plurality of lanes.

17. The computer program product of claim 15, wherein the method further comprises switching the data transmission system from the asynchronous operation mode to the synchronous operation mode based at least in part on a result of performing the AOPA.

18. The computer program product of claim 15, wherein the SOPA comprises an out-of-sync detection operation.

19. The computer program product of claim 15, wherein the method further comprises retraining the plurality of lanes to operate in the synchronous operation mode prior to switching the data transmission system from the asynchronous operation mode to the synchronous operation mode.

20. The computer program product of claim 15, wherein:
the data comprises serialized data that has been converted from parallel data; and
the method further comprises initiating a defective lane compensation operation based at least in part on a result of performing the LDA.

21. A computer-implemented method of automatically determining an operation mode of a data transmission system, the computer-implemented method comprising:
sending data from a transmitter through a plurality of lanes to a receiver using a synchronous operation mode;
wherein the synchronous operation mode comprises sending the data from the transmitter through the plurality of lanes to the receiver in a synchronous transmission manner that relies on an alignment between a transmitter clock frequency and a receiver clock frequency;
accessing synchronous operation performance metrics (SOPM) that result from sending the data from the transmitter through the plurality of lanes to the receiver using the synchronous operation mode; and
switching the data transmission system from the synchronous operation mode to an asynchronous operation mode based on at least in part on a result of a comparison between the SOPM and an SOPM error threshold;
wherein the asynchronous operation mode comprises sending the data from the transmitter through the plurality of lanes to the receiver without requiring alignment between the transmitter clock frequency and the receiver clock frequency; and
retraining the plurality of lanes to operate in the synchronous operation mode prior to switching the data transmission system from the asynchronous operation mode to the synchronous operation mode.

22. The computer-implemented method of claim 21 further comprising:
accessing asynchronous operation performance metrics (AOPM) that result from sending the data from the transmitter through the plurality of lanes to the receiver using the asynchronous operation mode; and performing a diagnosis of the transmitter, the plurality of lanes, and the receiver based at least in part on a result of a comparison between the AOPM and an AOPM error threshold;
wherein the SOPM comprises first lane quality data;
wherein the AOPM comprises second lane quality data; and
wherein the diagnosis comprises determining that a clock-alignment error has occurred based on the second lane quality data not exceeding the AOPM error threshold.

23. The computer-implemented method of claim 22, wherein:
the SOPM comprises first lane quality data;
the AOPM comprises second lane quality data;
the diagnosis comprises determining that a lane-degrade error has occurred based on the second lane quality data exceeding the AOPM error threshold;
the method further comprises initiating a defective lane compensation operation based at least in part on the diagnosis; and
the defective lane operation comprises rerouting the data such that the transmitter sends the data to the transmitter using non-defective lanes of the plurality of lanes.

24. A computer system for automatically determining an operation mode of a data transmission system, the computer system comprising a memory communicatively coupled to a processor, the processor configured to perform processor operations comprising:
controlling a transmitter to send data from the transmitter through a plurality of lanes to a receiver using a synchronous operation mode;
wherein the synchronous operation mode comprises sending the data from the transmitter through the plurality of lanes to the receiver in a synchronous transmission manner that relies on an alignment between a transmitter clock frequency and a receiver clock frequency;
accessing synchronous operation performance metrics (SOPM) that result from sending the data from the transmitter through the plurality of lanes to the receiver using the synchronous operation mode;
switching the data transmission system from the synchronous operation mode to an asynchronous operation mode based on at least in part on a result of a comparison between the SOPM and an SOPM error threshold;
wherein the asynchronous operation mode comprises sending the data from the transmitter through the plurality of lanes to the receiver without requiring alignment between the transmitter clock frequency and the receiver clock frequency; and
retraining the plurality of lanes to operate in the synchronous operation mode prior to switching the data transmission system from the asynchronous operation mode to the synchronous operation mode.

25. The computer system of claim 24, wherein the processor operations further comprise:
accessing asynchronous operation performance metrics (AOPM) that result from sending the data from the transmitter through the plurality of lanes to the receiver using the asynchronous operation mode;
performing a diagnosis of the transmitter, the plurality of lanes, and the receiver based at least in part on a result of a comparison between the AOPM and an AOPM error threshold;
wherein the SOPM comprises first lane quality data;
wherein the AOPM comprises second lane quality data;

wherein the diagnosis comprises determining that a clock-alignment error has occurred based on the second lane quality data not exceeding the AOPM error threshold;
wherein the SOPM comprises first lane quality data;
wherein the AOPM comprises second lane quality data;
wherein the diagnosis comprises determining that a lane-degrade error has occurred based on the second lane quality data exceeding the AOPM error threshold; and
initiating a defective lane compensation operation based at least in part on the diagnosis;
wherein the defective lane operation comprises rerouting the data such that the transmitter sends the data to the transmitter using non-defective lanes of the plurality of lanes.

\* \* \* \* \*